United States Patent
Niizuma

(10) Patent No.: US 9,854,709 B2
(45) Date of Patent: Dec. 26, 2017

(54) HEAT-TRANSFER DEVICE, POWER-SUPPLYING DEVICE, AND WIRELESS POWER-SUPPLYING SYSTEM

(71) Applicant: IHI Corporation, Tokyo (JP)

(72) Inventor: Motonao Niizuma, Tokyo (JP)

(73) Assignee: IHI Corporation, Tokyo (JP)

( * ) Notice: Subject to any disclaimer, the term of this patent is extended or adjusted under 35 U.S.C. 154(b) by 140 days.

(21) Appl. No.: 14/803,727

(22) Filed: Jul. 20, 2015

(65) Prior Publication Data

US 2015/0327405 A1 Nov. 12, 2015

Related U.S. Application Data

(63) Continuation of application No. PCT/JP2014/052962, filed on Feb. 7, 2014.

(30) Foreign Application Priority Data

Feb. 8, 2013 (JP) .................... 2013-023761
Nov. 19, 2013 (JP) .................... 2013-238711

(51) Int. Cl.
*H01F 27/42* (2006.01)
*H01F 37/00* (2006.01)
(Continued)

(52) U.S. Cl.
CPC .......... *H05K 7/20509* (2013.01); *B60L 5/005* (2013.01); *B60L 11/182* (2013.01);
(Continued)

(58) Field of Classification Search
CPC ........ H01F 27/16; H01F 38/14; Y02T 90/122; Y02T 10/7005; B60L 11/1829;
(Continued)

(56) References Cited

U.S. PATENT DOCUMENTS 4,347,472 A * 8/1982 Lemelson ........... B60L 11/1816
320/108
5,909,099 A 6/1999 Watanabe et al.
(Continued)

FOREIGN PATENT DOCUMENTS

CN  1186366 A  7/1998
CN  102610838 A  7/2012
(Continued)

OTHER PUBLICATIONS

International Search Report, PCT/JP2014/052962, dated Mar. 4, 2014, 1 pg.

*Primary Examiner* — Jared Fureman
*Assistant Examiner* — Esayas Yeshaw
(74) *Attorney, Agent, or Firm* — Volpe and Koenig, P.C.

(57) ABSTRACT

A wireless power-supply system (1) performing a wireless power supply between a vehicle (10) and a stop station (20), wherein the wireless power-supply system includes a heat-transfer device (30). The heat-transfer device (30) transfers heat generated due to the wireless power supply to the stop station (20) having high heat capacity from the vehicle (10) having low heat capacity. The heat-transfer device (30) includes a flexible heat-transfer member (32), in which the flexible heat-transfer member has tiltability in a moving direction of the vehicle (10).

15 Claims, 10 Drawing Sheets

(51) Int. Cl.

| | | |
|---|---|---|
| *H01F 38/00* | (2006.01) | |
| *H05K 7/20* | (2006.01) | |
| *H02J 5/00* | (2016.01) | |
| *H02J 7/02* | (2016.01) | |
| *B60L 5/00* | (2006.01) | |
| *B60M 7/00* | (2006.01) | |
| *H01F 38/14* | (2006.01) | |
| *H02J 17/00* | (2006.01) | |
| *H01F 27/16* | (2006.01) | |
| *B60L 11/18* | (2006.01) | |
| *H02J 50/10* | (2016.01) | |

(52) U.S. Cl.
CPC ....... *B60L 11/1829* (2013.01); *B60L 11/1833* (2013.01); *B60M 7/003* (2013.01); *H01F 27/16* (2013.01); *H01F 38/14* (2013.01); *H02J 5/005* (2013.01); *H02J 7/025* (2013.01); *H02J 17/00* (2013.01); *H02J 50/10* (2016.02); *B60L 2240/36* (2013.01); *Y02T 10/7005* (2013.01); *Y02T 10/7072* (2013.01); *Y02T 90/12* (2013.01); *Y02T 90/121* (2013.01); *Y02T 90/122* (2013.01); *Y02T 90/125* (2013.01); *Y02T 90/14* (2013.01)

(58) Field of Classification Search
CPC .. B60L 11/1833; B60L 2240/36; B60L 5/005; B60M 7/003; H02J 17/00; H02J 50/10; H02J 5/005; H02J 7/025; H05K 7/20509
See application file for complete search history.

(56) References Cited

U.S. PATENT DOCUMENTS

| | | | | |
|---|---|---|---|---|
| 2011/0204845 A1* | 8/2011 | Paparo | ........... | H01F 38/14 320/108 |
| 2012/0161530 A1* | 6/2012 | Urano | ........... | H02J 7/025 307/104 |
| 2012/0205985 A1* | 8/2012 | Inakagata | ........... | H02M 1/10 307/82 |
| 2013/0175987 A1* | 7/2013 | Amma | ........... | B60L 11/182 320/108 |
| 2014/0035520 A1* | 2/2014 | Nakayama | ........... | H02J 17/00 320/108 |
| 2014/0062392 A1* | 3/2014 | Lofy | ........... | H05K 7/20845 320/108 |
| 2014/0091757 A1* | 4/2014 | Proebstle | ........... | B60L 11/182 320/108 |
| 2014/0203629 A1* | 7/2014 | Hoffman | ........... | G01J 5/0022 307/9.1 |
| 2014/0217966 A1* | 8/2014 | Schneider | ........... | B60L 11/1829 320/108 |
| 2014/0292266 A1* | 10/2014 | Eger | ........... | B60L 11/182 320/108 |
| 2015/0013326 A1* | 1/2015 | Tait | ........... | F03B 17/02 60/496 |
| 2015/0053491 A1 | 2/2015 | Tang et al. | | |
| 2015/0130292 A1* | 5/2015 | Yeon | ........... | G05F 1/62 307/104 |

FOREIGN PATENT DOCUMENTS

| | | |
|---|---|---|
| CN | 202695109 U | 1/2013 |
| EP | 0715390 A1 | 6/1996 |
| JP | 2012-130177 A | 7/2012 |
| JP | 2012-147634 A | 8/2012 |
| JP | 2012-156083 A | 8/2012 |
| JP | 2012-216569 A | 11/2012 |
| JP | 2012-222956 A | 11/2012 |

\* cited by examiner

HEAT-TRANSFER DEVICE, POWER-SUPPLYING DEVICE, AND WIRELESS POWER-SUPPLYING SYSTEM

This application is a Continuation of International Application No. PCT/JP2014/052962, filed on Feb. 7, 2014, claiming priority based on Japanese Patent Application No. 2013-023761, filed on Feb. 8, 2013, and Japanese Patent Application No. 2013-238711, filed on Nov. 19, 2013, the content of which is incorporated herein by reference in their entirety.

TECHNICAL FIELD

The present disclosure relates to a wireless power-supplying system.

BACKGROUND ART

Patent Document 1 discloses an in-vehicle power-receiving device that wirelessly receives high-frequency power from a primary coil by using magnetic coupling or magnetic resonance between the primary coil provided on a road or the like and a secondary coil provided on a vehicle. The coils, which handle the high-frequency power, and the like generate heat in a wireless power-supplying system using the magnetic coupling or the like, and the coils are cooled.

The in-vehicle power-receiving device of Patent Document 1 includes a power-receiving coil, a coil chamber that stores the power-receiving coil, and a bidirectional fan of which a rotation direction can be switched between forward rotation and reverse rotation. According to the in-vehicle power-receiving device, a heat dissipation air flow flowing to the outside from a vehicle cabin via the power-receiving coil can be formed when the power-receiving coil needs to be cooled, and a warming air flow flowing to the vehicle cabin from the outside via the power-receiving coil can be formed when a power storage device needs to be warmed up.

Further, Patent Document 2 discloses a charging unit that wirelessly supplies and receives power by using a power-receiving device that includes a power-receiving part and a battery and a power-supplying device that includes a power-supplying part. In the charging unit, a heat transfer portion is provided at a portion where the power-receiving device and the power-supplying device come into contact with each other so that heat generated in the power-receiving device is transferred to the power-supplying device. Accordingly, the heat transferred to the power-supplying device is dissipated to the outside through a heat sink.

PRIOR ART DOCUMENT

Patent Document

[Patent Document 1] Japanese Unexamined Patent Application, First Publication No. 2012-156083
[Patent Document 2] Japanese Unexamined Patent Application, First Publication No. 2012-130177

SUMMARY

Technical Problem

However, the techniques in the related art have the following issues.

Since cooling is performed by a fan mounted on a vehicle in the technique of Patent Document 1, the size of the vehicle is increased due to a cooling device including the fan.

In the technique of Patent Document 2, a fan or the like is not mounted on the power-receiving device that is an object to be cooled and heat is transferred to the power-supplying device from the power-receiving device through contact. However, when the position of the power-receiving device relative to the position of the power-supplying device is not fixed exactly, heat-transfer efficiency is extremely lowered. For this reason, when a movable body such as a vehicle is an object to be cooled, time is required to accurately position the movable body at the time of stopping.

The disclosure has been made in consideration of the above-mentioned circumstances, and an object of the disclosure is to provide a heat-transfer device, a power-supplying device, and a wireless power-supplying system that can appropriately dissipate heat generated due to the wireless power supply without requiring time for the positioning when the power-receiving device and the power-supplying device are movable relative to each other.

Solution to Problem

According to a first aspect of the disclosure, there is provided a heat-transfer device that transfers heat between a power-receiving device and a power-supplying device for a wireless power supply, and at least one of the power-receiving device and the power-supplying device is movable. The heat-transfer device includes: a flexible heat-transfer member that transfers heat generated due to the wireless power supply, from one of the power-receiving device and the power-supplying device to the other thereof and has at least one of tiltability in the moving direction and extensibility in a direction perpendicular to the moving direction.

According to a second aspect of the disclosure, in the first aspect, each of the power-receiving device and the power-supplying device includes a coil that performs the wireless power supply, and the heat-transfer device further includes a heat transfer plate that is provided around the coil of one of the power-receiving device and the power-supplying device, and the flexible heat-transfer member that is erected around the coil of the other of the power-receiving device and the power-supplying device and comes into contact with the heat transfer plate.

According to a third aspect of the disclosure, in the second aspect, the flexible heat-transfer member includes a metal brush and the metal brush is implanted in a metal pipe in which a refrigerant flows.

According to a fourth aspect of the disclosure, in the second aspect, the flexible heat-transfer member includes a spring member, and the spring member biases a metal pipe, in which a refrigerant flows, to the heat transfer plate.

According to a fifth aspect of the disclosure, in the second aspect, the flexible heat-transfer member includes an expansion-contraction member that comes into contact with the heat transfer plate through injection of a refrigerant.

According to a sixth aspect of the disclosure, in the fifth aspect, the expansion-contraction member includes at least one of a rod-like tube and an arch-like tube.

According to a seventh aspect of the disclosure, in any one of the first to sixth aspects, one of the power-receiving device and the power-supplying device is a vehicle and the other of the power-receiving device and the power-supplying device is a stop station at which the vehicle stops.

According to an eighth aspect of the disclosure, in the fifth aspect, the expansion-contraction member is non-magnetic and non-electrically conductive.

According to a ninth aspect of the disclosure, in the fifth aspect, the expansion-contraction member is provided on an opposing surface where the coils face each other during the wireless power supply.

According to a tenth aspect of the disclosure, in the eighth aspect, the expansion-contraction member includes an injection-discharge port that functions as both an injection port and a discharge port for the refrigerant, and the heat-transfer device further includes a refrigerant injector that is connected to the injection-discharge port and switches the injection and non-injection of the refrigerant.

According to an eleventh aspect of the disclosure, in the eighth aspect, the expansion-contraction member includes an injection port and a discharge port for the refrigerant, and the heat-transfer device further includes a refrigerant injector that is connected to the injection port and injects the refrigerant while the refrigerant is discharged from the discharge port.

According to a twelfth aspect of the disclosure, in the eighth aspect, the expansion-contraction member includes an injection port and a discharge port for the refrigerant, and the heat-transfer device further includes a refrigerant injector that is connected to the injection port and the discharge port and injects at least part of the refrigerant, which is discharged from the discharge port, into the injection port and circulates the refrigerant.

According to a thirteenth aspect of the disclosure, in the eighth aspect, a plurality of the expansion-contraction members are provided at positions that are different from each other, and the heat-transfer device further includes a refrigerant injector that separately and independently injects the refrigerant into the plurality of expansion-contraction members.

According to a fourteenth aspect of the disclosure, in a power-supplying device that wirelessly supplies power to a power-receiving device, the power-supplying device includes a heat-transfer device that transfers heat generated due to the wireless power supply from one of the power-receiving device and the power-supplying device, of which at least one is movable, to the other thereof. The heat-transfer device includes a flexible heat-transfer member that has at least one of tiltability in the moving direction and extensibility in a direction perpendicular to the moving direction.

According to a fifteenth aspect of the disclosure, in a wireless power-supplying system that performs a wireless power supply between a power-receiving device and a power-supplying device of which at least one is movable, the wireless power-supplying system includes a heat-transfer device that transfers heat generated due to the wireless power supply from one of the power-receiving device and the power-supplying device to the other thereof. The heat-transfer device includes a flexible heat-transfer member that has at least one of tiltability in the moving direction and extensibility in a direction perpendicular to the moving direction.

Advantageous Effects of Disclosure

According to the disclosure, even though the position of the power-receiving device relative to the position of the power-supplying device is not fixed, the flexible heat-transfer member is tilted in the moving direction. Accordingly, a state in which the power-receiving device and the power-supplying device are thermally connected to each other is maintained. For this reason, high cooling capacity is obtained while positional deviation is allowed.

Accordingly, there are obtained a heat-transfer device, a power-supplying device, and a wireless power-supplying system that can appropriately dissipate heat generated due to the wireless power supply (appropriately cool a coil generating heat) without requiring time to position a power-receiving device and the power-supplying device when the power-receiving device and the power-supplying device are movable relative to each other.

DESCRIPTION OF EMBODIMENTS

Embodiments of the disclosure will be described below with reference to the drawings.

First Embodiment

Figure 1:
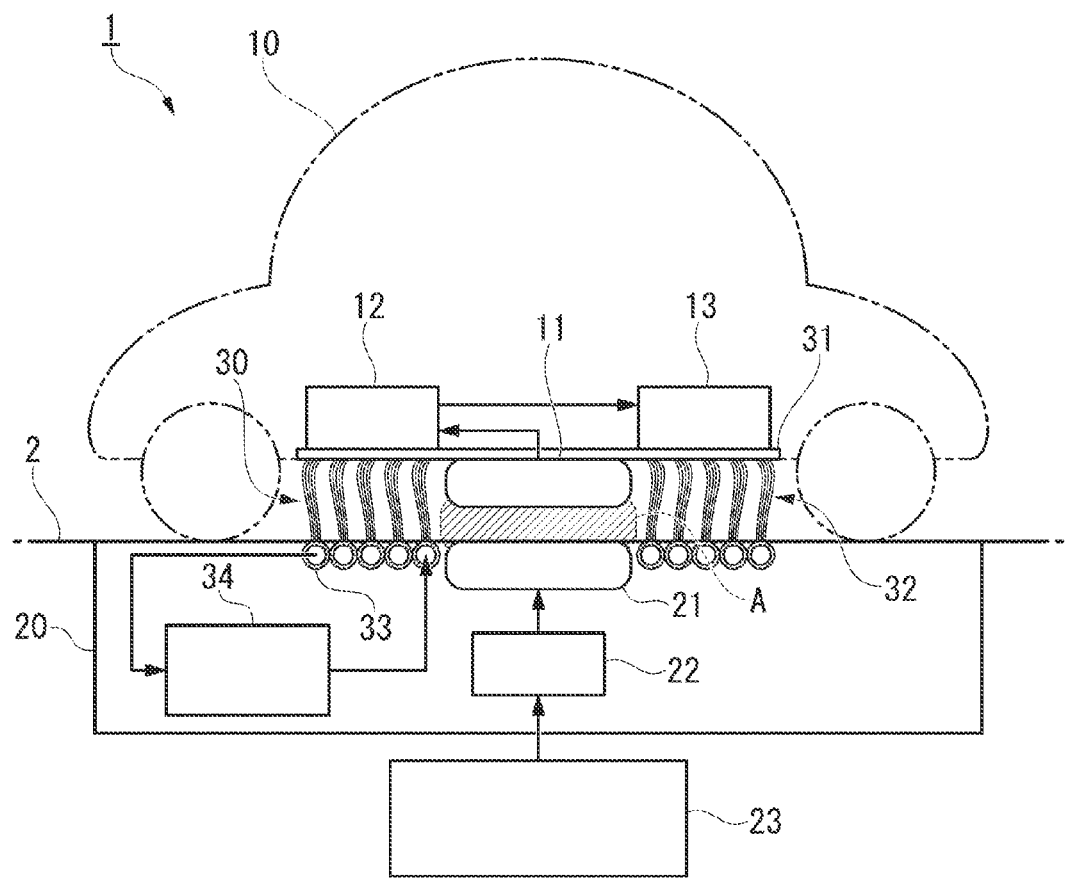
FIG. 1 is a view showing the entire structure of a wireless power-supplying system of a first embodiment of the disclosure.
Figure 2:
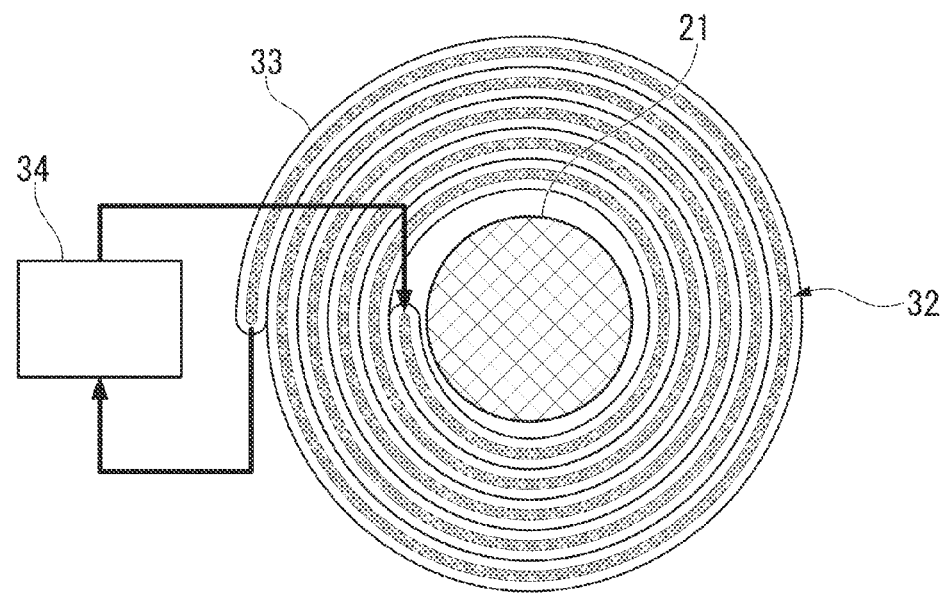
FIG. 2 is a plan view of a flexible heat-transfer member of the first embodiment of the disclosure.

FIG. 1 is a view showing the entire structure of a wireless power-supplying system 1 of a first embodiment of the disclosure. FIG. 2 is a plan view of a flexible heat-transfer member 32 of the first embodiment of the disclosure.

The wireless power-supplying system 1 performs the wireless power supply between a power-receiving device and a power-supplying device of which at least one is movable. In this embodiment, as shown in FIG. 1, a vehicle 10 is a power-receiving device and a stop station 20 at which the vehicle 10 stops is a power-supplying device. The vehicle 10 is movable relative to the stop station 20 installed on a road surface 2.

The vehicle 10 is provided with a power-receiving coil (coil) 11. The stop station 20 is provided with a power-transmitting coil (coil) 21. The power-receiving coil 11 is provided on the bottom of the vehicle 10 so as to be capable of facing the power-transmitting coil 21. The power-receiving coil 11 has substantially the same diameter as that of the power-transmitting coil 21, and wirelessly receives AC power by being electromagnetically coupled to the power-transmitting coil 21.

The wireless power supply to the power-receiving coil 11 from the power-transmitting coil 21 in the wireless power-supplying system 1 of this embodiment is performed on the basis of a magnetic field resonance method. That is, a resonance capacitor (not shown) of a resonance circuit is connected to each of the power-transmitting coil 21 and the power-receiving coil 11. Further, for example, the capacitance of the resonance capacitor is set so that the resonance frequency of a power supply-side resonance circuit including the power-transmitting coil 21 and the resonance capacitor is equal to the resonance frequency of a power-receiving-side resonance circuit including the power-receiving coil 11 and the resonance capacitor.

The vehicle 10 is provided with a power-receiving circuit 12 and a battery 13 in addition to the power-receiving coil 11.

The power-receiving circuit 12 is a power conversion circuit that converts power, which is received from the power-transmitting coil 21, into DC power and supplies the DC power to the battery 13. That is, the power-receiving circuit 12 charges the battery 13 by supplying a charging current according to the charge state of the battery 13 to the battery 13.

The battery 13 is a secondary battery that can accumulate enough power as a driving power source for the vehicle 10, and is, for example, a lithium-ion secondary battery, a nickel-hydrogen secondary battery, or the like.

The power-transmitting coil 21 is embedded in the road surface 2 so as to be capable of facing the power-receiving coil 11. The stop station 20 is provided with a power-supplying circuit 22 and an external power source 23 in addition to the power-transmitting coil 21.

The power-supplying circuit 22 is a power conversion circuit that converts power, which is received from the external power source 23, into AC power according to the resonance frequency of the wireless power supply in a magnetic field resonance method and supplies the AC power to the power-transmitting coil 21.

The external power source 23 is, for example, a commercial power source, a solar battery, wind power generation, or the like, and supplies electrical power to the power-supplying circuit 22.

As shown in FIG. 1, the wireless power-supplying system 1 includes a heat-transfer device 30 for transferring heat, which is generated due to the wireless power supply between the vehicle 10 and the stop station 20, to the stop station 20 from the vehicle 10. For example, the heat-transfer device 30 transfers heat to the stop station 20, which has high heat capacity, from the vehicle 10 that has low heat capacity. Alternatively, the heat-transfer device 30 can transfer heat to the stop station 20, which has high cooling capacity, from the vehicle 10 that has low cooling capacity. In particular, since it is easy to ensure access to a refrigerant in the stop station 20 in comparison with the vehicle 10 that is a movable body, it is easy to increase the cooling capacity of the stop station 20. The heat-transfer device 30 may transfer heat to the vehicle 10 from the stop station 20 depending on heat capacity or cooling capacity.

The heat-transfer device 30 of this embodiment includes a heat transfer plate 31 that is provided around the power-receiving coil 11 and a flexible heat-transfer member 32 that is erected around the power-transmitting coil 21 and comes into contact with the heat transfer plate 31.

The heat transfer plate 31 is provided on the vehicle 10. The heat transfer plate 31 is provided on the bottom of the vehicle 10 so as to face the road surface 2. Since the heat transfer plate 31 is disposed on the back side of the power-receiving coil 11, the heat transfer plate 31 does not block an electromagnetic field A formed between the power-receiving coil 11 and the power-transmitting coil 21 during the wireless power supply. The power-receiving coil 11 is supported at the center of the heat transfer plate 31 and the heat transfer plate 31 extends outward from the power-receiving coil 11.

The heat transfer plate 31 is thermally connected to the power-receiving coil 11. Further, in this embodiment, the power-receiving circuit 12 and the battery 13 are provided on the heat transfer plate 31 and the heat transfer plate 31 is also thermally connected to the power-receiving circuit 12 and the battery 13. The heat transfer plate 31 is formed of, for example, a metal plate having electrical conductivity. For this reason, the heat transfer plate 31 not only has a thermal function to transfer heat but also an electrical function to electrically ground the power-receiving circuit 12 and the like.

The flexible heat-transfer member 32 is provided in the stop station 20. The flexible heat-transfer member 32 is erected upward from the stop station 20 in a substantially vertical direction. A base end of the flexible heat-transfer member 32 is fixed to the stop station 20 and a tip thereof is a free end, and the flexible heat-transfer member 32 has tiltability in a moving direction of the vehicle 10 (a planar direction parallel to the road surface 2 in this embodiment).

Since the flexible heat-transfer member 32 is formed so as to have a length that is longer than a distance between the stop station 20 and the heat transfer plate 31, the tip of the flexible heat-transfer member 32 can come into contact with the heat transfer plate 31 with a predetermined width. The flexible heat-transfer member 32 does not necessarily need to come into contact with the heat transfer plate 31, and only has to be thermally coupled to at least the heat transfer plate 31.

The flexible heat-transfer member 32 of this embodiment is formed of a metal brush that has thermal conductivity and electrical conductivity. For this reason, the flexible heat-transfer member 32 not only has a thermal function to transfer heat but also an electrical function to electrically ground the heat transfer plate 31 on the ground.

The flexible heat-transfer member 32 is implanted in a metal pipe 33 in which cooling water serving as a refrigerant flows. The metal pipe 33 is provided in the stop station 20. As shown in FIG. 2, the metal pipe 33 is wound around the power-transmitting coil 21 in a spiral shape.

The metal pipe 33 of this embodiment is disposed in the same plane and spreads out from the power-transmitting coil 21.

The metal pipe 33 is connected to a cooling water circulating device 34. The cooling water circulating device 34 makes cooling water flow in a spiral shape from an inner end portion of the metal pipe 33, which is close to the power-transmitting coil 21, toward an outer end portion thereof. The flexible heat-transfer member 32 is implanted in a spiral shape along the metal pipe 33. As shown in FIG. 1, the flexible heat-transfer member 32 forms multiple shield walls around the electromagnetic field A. Further, the flexible heat-transfer member 32 not only has a thermal function to transfer heat but also an electrical function to electrically ground the heat transfer plate 31 on the ground.

Next, the power supply operation of the wireless power-supplying system 1 having the above-mentioned structure will be described.

As shown in FIG. 1, the wireless power-supplying system 1 performs the wireless power supply between the vehicle 10 and the stop station 20. Since the stop position of the vehicle 10 depends on a driver's driving operation, the stop position of the vehicle 10 has a certain amount of variation. Since a magnetic field resonance method is employed to transmit power between the power-receiving coil 11 and the power-transmitting coil 21 in regard to the supply of power, the wireless power-supplying system 1 has tolerance to positional deviation between resonance coils provided in both the vehicle 10 and the stop station 20 and can efficiently transmit power over a long distance.

When the wireless power supply is performed, the power-receiving coil 11, the power-transmitting coil 21, and the like, which supply and receive high-frequency power, generate heat. Since the stop station 20, which is provided with the power-transmitting coil 21, is installed on the ground, it can be regarded that the heat capacity of the stop station 20 is infinite. For this reason, the temperature of the power-transmitting coil 21 hardly rises. Since the heat capacity of the vehicle 10, which is provided with the power-receiving coil 11, is smaller than that of the stop station 20, the temperature of the power-receiving coil 11 rises relatively easily.

The wireless power-supplying system 1 includes the heat-transfer device 30 for transferring heat, which is generated due to the wireless power supply, to the stop station 20, which has high heat capacity, from the vehicle 10 that has low heat capacity. The heat-transfer device 30 cools the vehicle 10 by transferring heat, which is generated in the vehicle 10 during the wireless power supply, to the stop station 20. The heat-transfer device 30 includes the flexible heat-transfer member 32 that is tiltable in the moving direction of the vehicle 10.

Since the stop position of the vehicle 10 has a certain amount of variation as described above, it cannot be expected that the power-receiving coil 11 and the power-transmitting coil 21 exactly face each other. Since the flexible heat-transfer member 32 is flexibly tilted in the moving direction of the vehicle 10 that is at a position where the power-receiving coil 11 and the power-transmitting coil 21 substantially face each other but there is positional deviation between them, a state in which the vehicle 10 and the stop station 20 are thermally connected to each other is maintained. Accordingly, it is possible to obtain high cooling capacity by the transfer of heat without providing a cooling device such as a fan in the vehicle 10 while positional deviation between the vehicle 10 and the stop station 20 is allowed.

The heat-transfer device 30 of this embodiment includes the heat transfer plate 31 that is provided around the power-receiving coil 11 and the flexible heat-transfer member 32 that is erected around the power-transmitting coil 21 and comes into contact with the heat transfer plate 31. Since it is possible to cool the vehicle 10 without blocking the electromagnetic field A formed between the power-receiving coil 11 and the power-transmitting coil 21 during the wireless power supply, it is possible to prevent the deterioration of power-supplying efficiency.

Further, since the heat transfer plate 31 is provided around the power-receiving coil 11, it is possible to cool not only the power-receiving coil 11 but also the power-receiving circuit 12 or the battery 13 by transferring not only the heat of the power-receiving coil 11 but also the heat of the power-receiving circuit 12 or of the battery 13 to the metal surface of the heat transfer plate 31.

Furthermore, since the flexible heat-transfer member 32 is electrically grounded, it is also possible to ground the power-receiving circuit 12 and the like through the heat transfer plate 31 during the wireless power supply. Moreover, the flexible heat-transfer member 32 functions as an electromagnetic shield wall, prevents foreign matter and the like from entering, and enables formation of a strong electromagnetic field A.

The flexible heat-transfer member 32 of this embodiment is implanted in the metal pipe 33 in which cooling water flows. Accordingly, it is possible to remove heat, which is transferred to the stop station 20 installed on the ground from the vehicle 10 through brush fiber of the flexible heat-transfer member 32, by the cooling water. As shown in FIG. 2, cooling water flows in a spiral shape from the inner end portion of the metal pipe 33, which is close to the power-transmitting coil 21, toward the outer end portion thereof. Therefore, it is possible to preferentially take heat away from the vicinity of the power-transmitting coil 21, which handles high-frequency power, by cooling water of which the temperature is low.

As described above, the above-mentioned embodiment provides the wireless power-supplying system 1 that performs the wireless power supply between the vehicle 10 and the stop station 20, and the wireless power-supplying system 1 includes the heat-transfer device 30 for transferring heat, which is generated due to the wireless power supply, to the stop station 20, which has high heat capacity, from the vehicle 10 that has low heat capacity. The heat-transfer device 30 includes the flexible heat-transfer member 32 that is tiltable in the moving direction of the vehicle 10. Therefore, according to the wireless power-supplying system 1, a high cooling capacity is obtained without a cooling device provided in the vehicle 10 while positional deviation is allowed.

Accordingly, the wireless power-supplying system 1, which can appropriately dissipate heat generated due to the wireless power supply without requiring time to position the vehicle 10 and the stop station 20 when the vehicle 10 and the stop station 20 are movable relative to each other, is obtained in this embodiment.

Second Embodiment

Next, a second embodiment of the disclosure will be described. In the following description, the same components as the components of the above-mentioned embodiment or components equivalent to the components of the above-mentioned embodiment will be denoted by the same reference numerals and the description thereof will be omitted.

Figure 3:
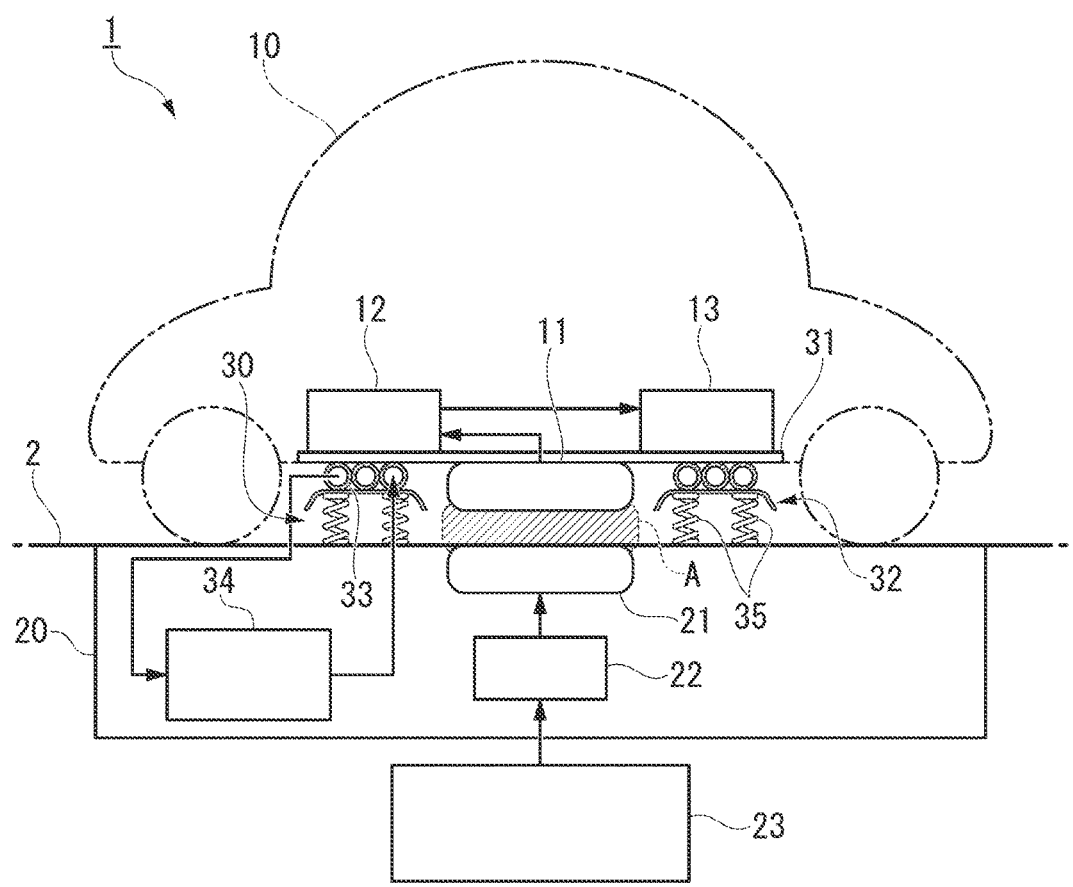
FIG. 3 is a view showing the entire structure of a wireless power-supplying system of a second embodiment of the disclosure.

FIG. 3 is a view showing the entire structure of a wireless power-supplying system 1 of the second embodiment of the disclosure.

The second embodiment is different from the first embodiment in that a flexible heat-transfer member 32 includes spring members 35 as shown in FIG. 3.

The spring members 35 are erected upward from the stop station 20 substantially in a vertical direction. The spring members 35 bias the metal pipe 33, in which cooling water flows, to the heat transfer plate 31.

Further, a base end of the spring member 35 is fixed to the stop station 20 and a tip thereof supporting the metal pipe 33 is a free end, and the spring member 35 is tiltable in a moving direction of the vehicle 10 (a planar direction parallel to the road surface 2 in this embodiment).

According to the second embodiment having the above-mentioned structure, it is possible to take away the heat of the vehicle 10 by directly pressing the metal pipe 33 against the heat transfer plate 31. Further, the flexible heat-transfer member 32 becomes tiltable in the moving direction of the vehicle 10 by the action of the spring members 35. Since the positional deviation between the vehicle 10 and the stop station 20 is allowed, it is possible to remove heat generated due to the wireless power supply without requiring time to position the vehicle 10 and the stop station 20. Furthermore, when the spring member 35 is made of a metal material, it is possible to electrically ground the heat transfer plate 31 on the ground.

The spring member 35 may also have tiltability or have extensibility in a direction perpendicular to the moving direction of the vehicle 10 instead of tiltability. For example, the spring member 35 may be adapted to be maintained while being compressed until the vehicle stops and to extend when the vehicle stops. Since the spring member 35 extends until the metal pipe 33 comes into contact with the heat transfer plate 31, cooling water in the metal pipe 33 can cool the vehicle 10 (the power-receiving coil 11, the power-receiving circuit 12, or the battery 13) through the heat transfer plate 31.

Third Embodiment

Next, a third embodiment of the disclosure will be described. In the following description, the same components as the components of the above-mentioned embodiments or components equivalent to the components of the above-mentioned embodiments will be denoted by the same reference numerals and the description thereof will be omitted.

Figure 4:
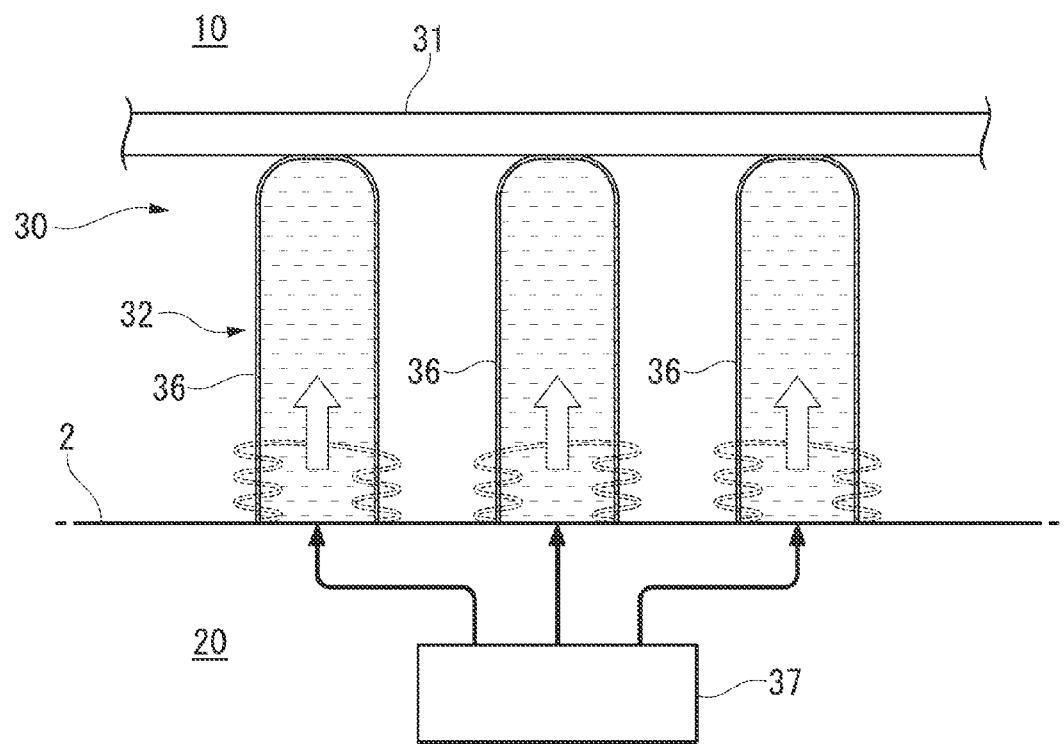
FIG. 4 is a cross-sectional view of a flexible heat-transfer member of a third embodiment of the disclosure.

FIG. 4 is a cross-sectional view of a flexible heat-transfer member 32 of the third embodiment of the disclosure.

The third embodiment is different from the above-mentioned embodiments in that the flexible heat-transfer member 32 includes expansion-contraction members 36 coming into contact with the heat transfer plate 31 through the injection of cooling water as shown in FIG. 4.

The expansion-contraction member 36 is a flexible resin member that is provided on the stop station 20, is made of elastomer or the like, and has extensibility. An expansion-contraction direction is a direction perpendicular to the moving direction of the vehicle 10. The expansion-contraction member 36 is a rod-like tube of which the tip is closed, and is connected to a cooling water injector (refrigerant injector) 37. Since the cooling water injector 37 is connected to, for example, a water supply or the like, the cooling water injector 37 can inject cooling water serving as a refrigerant into the expansion-contraction members 36 with predetermined water pressure by opening and closing a valve (not shown). Before the injection of cooling water, the expansion-contraction members 36 are in a contracted state as shown by a dotted line of FIG. 4. However, the expansion-contraction members 36 stand up in the shape of a rod through the injection of cooling water and come into contact with the heat transfer plate 31.

Even when the vehicle 10 is shaken in a lateral direction due to an influence of wind or the like and the positional deviation of the heat transfer plate 31 is caused, a state in which the expansion-contraction members 36 come into contact with the heat transfer plate 31 can be maintained since the expansion-contraction members 36 have extensibility. Accordingly, the heat transfer plate 31 can be cooled by a refrigerant in the expansion-contraction members 36.

In addition, regardless of the position of the heat transfer plate 31 that the expansion-contraction members 36 come into contact with, the expansion-contraction members 36 can cool the heat transfer plate 31. Accordingly, when a refrigerant is injected into the expansion-contraction members 36 and the expansion-contraction members 36 are operated to come into contact with the heat transfer plate 31 after the vehicle 10 stops, the expansion-contraction members 36 can come into contact with the heat transfer plate 31 and cool the transfer plate 31 even though the stop position of the vehicle 10 deviates.

Since the expansion-contraction member 36 is made of a deformable material, the expansion-contraction member 36 may have not only extensibility but also tiltability in the moving direction of the vehicle 10.

Further, the surface of the expansion-contraction member 36 may be coated with aluminum, or a plurality of thin metal wires, which do not hinder expansion and contraction, may be attached to the surface of the expansion-contraction member 36 in a mesh shape or along the direction toward the ground from the surface of the expansion-contraction member 36 facing the heat transfer plate 31. This structure enables electrical grounding of the heat transfer plate 31 on the ground through the coated aluminum or the metal wires when the expansion-contraction members 36 stand up in the shape of a rod through the injection of cooling water and come into contact with the heat transfer plate 31.

Furthermore, since the expansion-contraction members 36 remove heat by coming into contact with the heat transfer plate 31, cooling water injected into the expansion-contraction members 36 is heated and the cooling capacity of the expansion-contraction members is reduced as time goes by. It is possible to keep cooling capacity by discharging the heated cooling water from the expansion-contraction members 36 with an operation of a drain valve (not shown) and injecting cold cooling water into the expansion-contraction members 36 again.

According to the third embodiment having the above-mentioned structure, it is possible to take away the heat of the vehicle 10 by pressing the expansion-contraction members 36, into which cooling water is injected, against the heat transfer plate 31. Further, the flexible heat-transfer member 32 becomes tiltable in the moving direction of the vehicle 10 by the action of the expansion-contraction members 36 into which cooling water is injected. Since the positional deviation between the vehicle 10 and the stop station 20 is allowed, it is possible to remove heat generated due to the wireless power supply without requiring time to position the vehicle 10 and the stop station 20. Furthermore, since the expansion-contraction members 36 do not come into contact with the heat transfer plate 31 and the like when cooling water is drained off from the expansion-contraction members 36, the vehicle 10 is not rubbed on the expansion-contraction members 36.

Fourth Embodiment

Next, a fourth embodiment of the disclosure will be described. In the following description, the same components as the components of the above-mentioned embodiments or components equivalent to the components of the above-mentioned embodiments will be denoted by the same reference numerals and the description thereof will be omitted.

Figure 5:
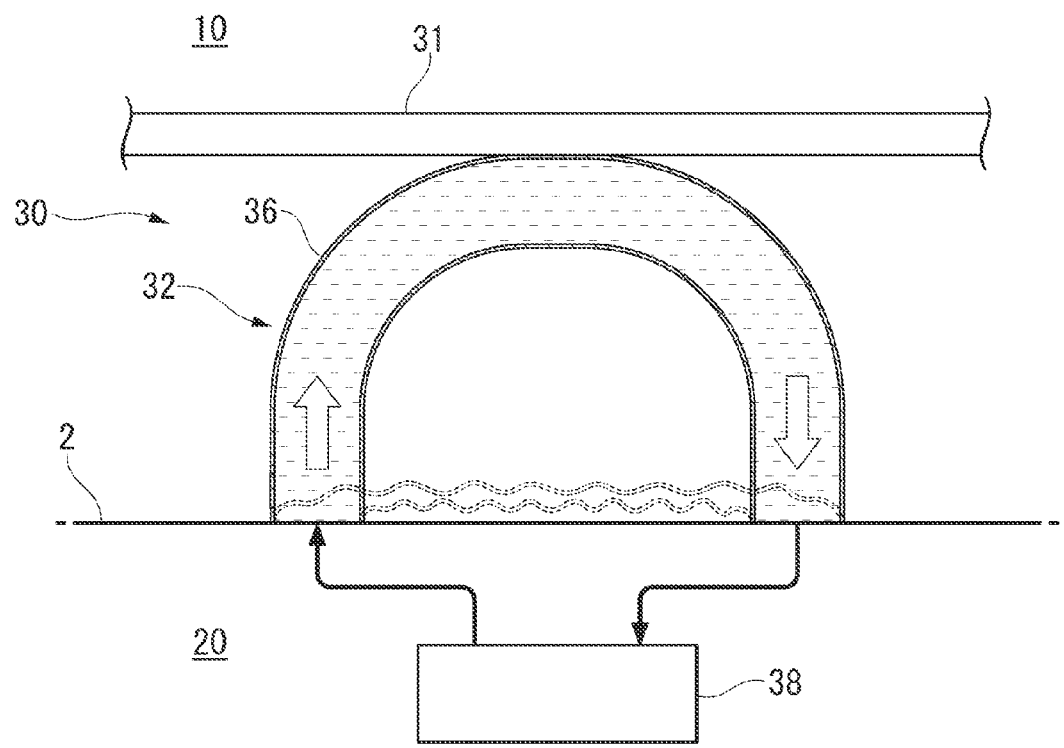
FIG. 5 is a cross-sectional view of a flexible heat-transfer member of a fourth embodiment of the disclosure.

FIG. 5 is a cross-sectional view of a flexible heat-transfer member 32 of the fourth embodiment of the disclosure.

The fourth embodiment is different from the above-mentioned embodiments in that an expansion-contraction member 36 is an arch-like tube as shown in FIG. 5.

The expansion-contraction member 36 of the fourth embodiment is a tube of which one end and the other end are disposed on the road surface 2 with a predetermined distance therebetween, and is connected to a circulation-type cooling water injector 38. Since the circulation-type cooling water injector 38 is connected to, for example, a water supply or the like, the circulation-type cooling water injector 38 forms a circulating flow of cooling water, which flows to the other end of the expansion-contraction member 36 from one end thereof, by opening and closing a valve (not shown). Before the injection of cooling water, the expansion-contraction member 36 is in a contracted state as shown by a dotted line in FIG. 5. However, the expansion-contraction member 36 stands up in the shape of an arch through the injection of cooling water and comes into contact with the heat transfer plate 31.

The surface of the expansion-contraction member 36 may be coated with aluminum, or a plurality of thin metal wires, which do not hinder expansion and contraction, may be attached to the surface of the expansion-contraction member 36 in a mesh shape or along the direction toward the ground from the surface of the expansion-contraction member 36 facing the heat transfer plate 31. This structure enables electrical grounding of the heat transfer plate 31 on the ground through the coated aluminum or the metal wires when the expansion-contraction member 36 stands up in the shape of an arch through the injection of cooling water and comes into contact with the heat transfer plate 31.

According to the fourth embodiment having the above-mentioned structure, it is possible to take away the heat of the vehicle 10 by pressing the expansion-contraction member 36, into which cooling water is injected, against the heat transfer plate 31. Further, according to the expansion-contraction member 36 of the fourth embodiment, since cooling water in the expansion-contraction member 36 is circulated and interchanged, it is possible to cool the vehicle 10 for a long time. Even when the wireless power supply is performed for a long time, the cooling water injector 37 does not need to intermittently open and close a valve to interchange cooling water therein through the switching of the discharge and injection of cooling water unlike in, for example, the third embodiment.

Furthermore, the flexible heat-transfer member 32 becomes tiltable in the moving direction of the vehicle 10 by the action of the expansion-contraction member 36 into which cooling water is injected. Since the positional deviation between the vehicle 10 and the stop station 20 is allowed, it is possible to remove heat generated due to the wireless power supply without requiring time to position the vehicle 10 and the stop station 20. Moreover, since the expansion-contraction member 36 does not come into contact with the heat transfer plate 31 and the like when cooling water is drained off from the expansion-contraction member 36, the vehicle 10 is not rubbed on the expansion-contraction member 36.

Figure 6:
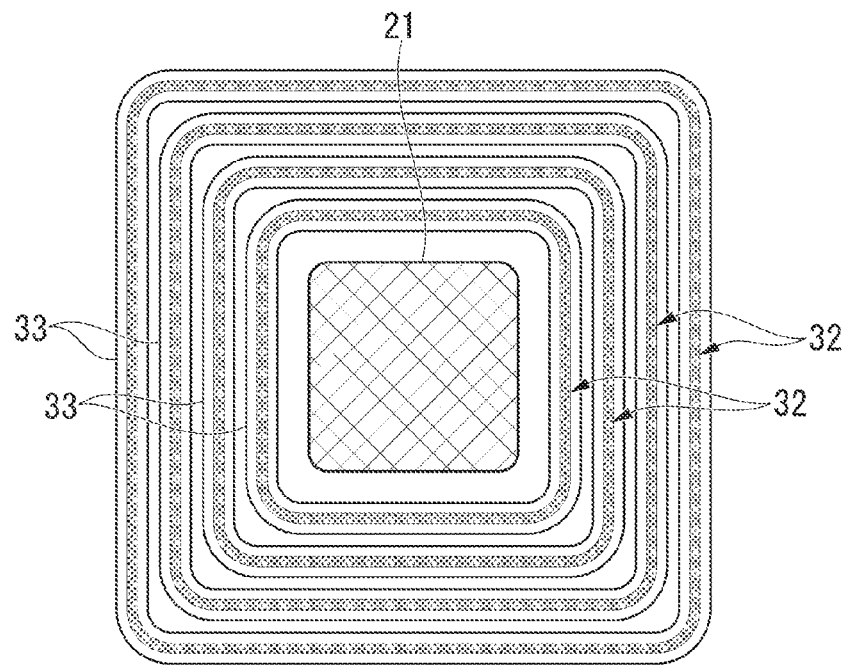
FIG. 6 is a plan view of a flexible heat-transfer member of a first modification of the disclosure.
Figure 7:
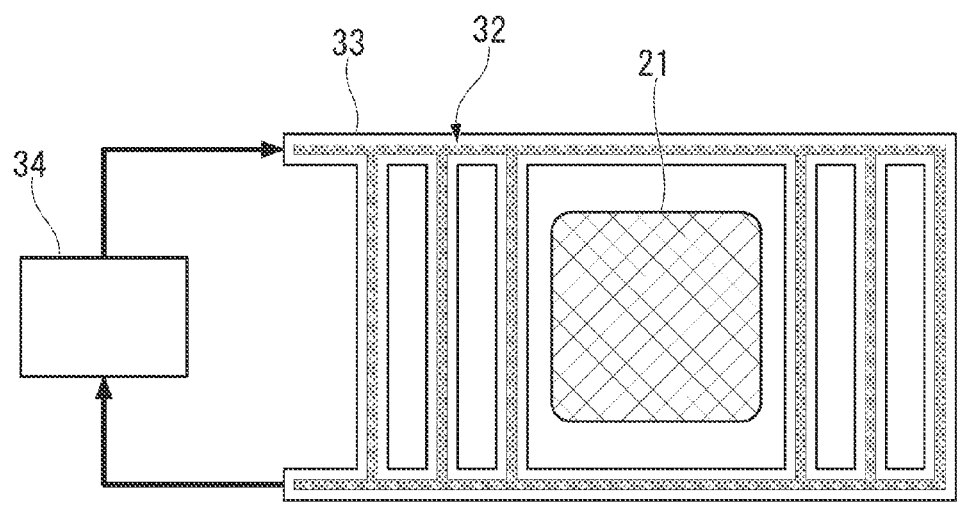
FIG. 7 is a plan view of a flexible heat-transfer member of a second modification of the disclosure.

A structure in which the metal pipe 33 is wound in a spiral shape has been described in the above-mentioned embodiments, but the disclosure is not limited thereto. For example, multiple metal pipes 33 having a rectangular shape may be disposed around the power-transmitting coil 21 as shown in FIG. 6. Further, for example, a ladder-shaped metal pipe 33 may be disposed around the power-transmitting coil 21 as shown in FIG. 7.

Furthermore, for example, in the above-mentioned embodiments, cooling water has been exemplified as a refrigerant flowing in the metal pipe 33 or a refrigerant injected into the expansion-contraction member 36. However, liquid other than water may be used as the refrigerant.

Moreover, for example, when the heat capacity of the ground is high in the first or second embodiment, heat transferred to the metal pipe 33 may be directly transferred to the ground without the use of cooling water. A material having high thermal conductivity, such as metal, is used for the spring member 35 in the case of the second embodiment. In this case, a metal plate may be used instead of the metal pipe 33 and a metal brush may be implanted in the metal plate.

Further, for example, the flexible heat-transfer member 32 has come into contact with the heat transfer plate 31 in the above-mentioned embodiments, but the disclosure is not limited to this structure. For example, a body of the vehicle 10 may function as the heat transfer plate 31, and the heat transfer plate 31 may function as a shield plate for the coils.

When the heat transfer plate 31 has a shielding function as the shield plate, the heat transfer plate 31 needs to be made of a non-magnetic material having high thermal conductivity and high electrical conductivity. A material, which satisfies these three conditions, is, for example, copper or aluminum. Furthermore, the entire heat transfer plate 31 does not need to be made of the material that satisfies the three conditions. For example, only the surface of the heat transfer plate 31 facing the power-receiving coil 11 may be made of the material, which satisfies the three conditions, within a predetermined thickness. Alternatively, among portions, which are positioned near the power-receiving coil 11, of the surface of the heat transfer plate 31 facing the power-receiving coil 11 and peripheral portions thereof, only areas where a magnetic field is generated during the wireless power supply and preferably needs to be shielded may be made of material that satisfies the three conditions.

Figure 8:
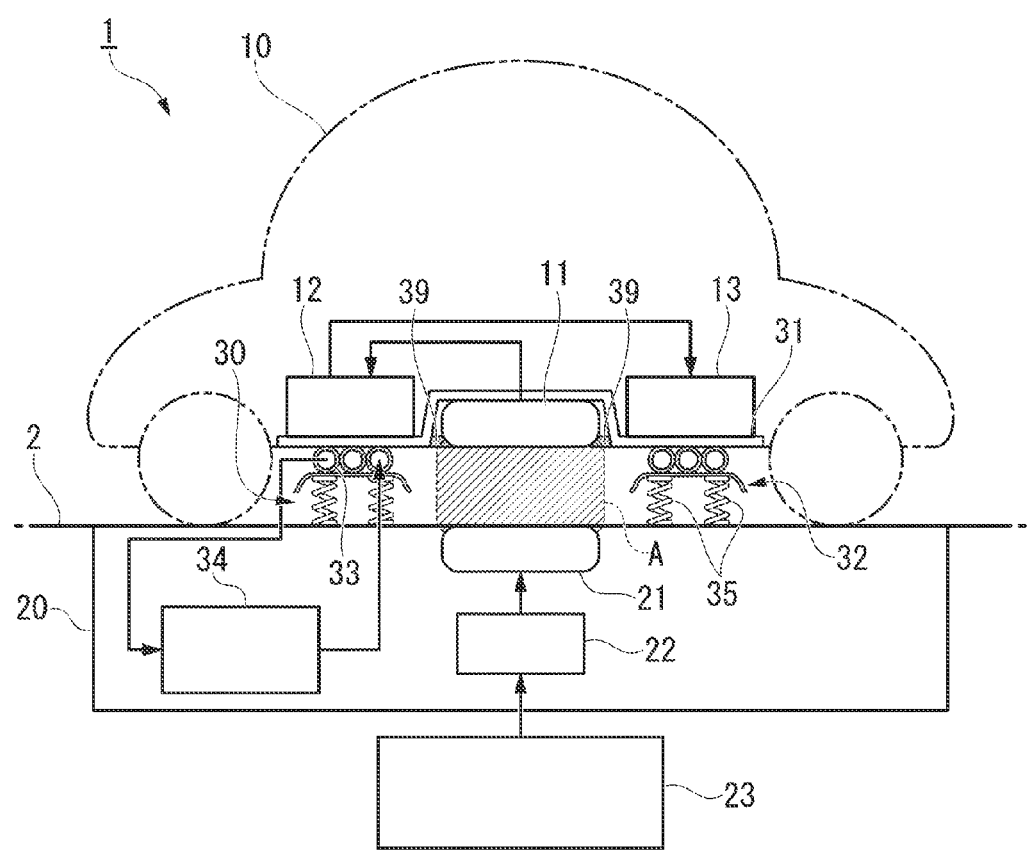
FIG. 8 is a view showing the entire structure of a wireless power-supplying system of a third modification of the disclosure.

Moreover, in order to reduce an influence on the power-receiving coil 11 that is caused when the tilted flexible heat-transfer member 32 is rubbed on the power-receiving coil 11 in the first embodiment and an influence on the power-receiving coil 11 that is caused when the metal pipe 33 biased upward by the compressed spring members 35 is rubbed on the power-receiving coil 11 in the second embodiment, when the vehicle 10 moves for example, a heat transfer plate 31 including a dent shown in FIG. 8 may be used so that the lower surface of the power-receiving coil 11 does not protrude from the heat transfer plate 31. FIG. 8 shows an example in which the heat transfer plate 31 including a dent is applied to the second embodiment. A seal material 39 may be disposed at the periphery of the power-receiving coil 11, and the periphery of the power-receiving coil 11 may be formed flush with the lower surface of the heat transfer plate 31 by using a material that does not block an electromagnetic field A, for example, an engineering plastic material, a resin material, or fiber reinforced plastics (FRP).

Fifth Embodiment

Next, a fifth embodiment of the disclosure will be described. In the following description, the same components as the components of the above-mentioned embodiments or components equivalent to the components of the above-mentioned embodiments will be denoted by the same reference numerals and the description thereof will be omitted.

Figure 9:
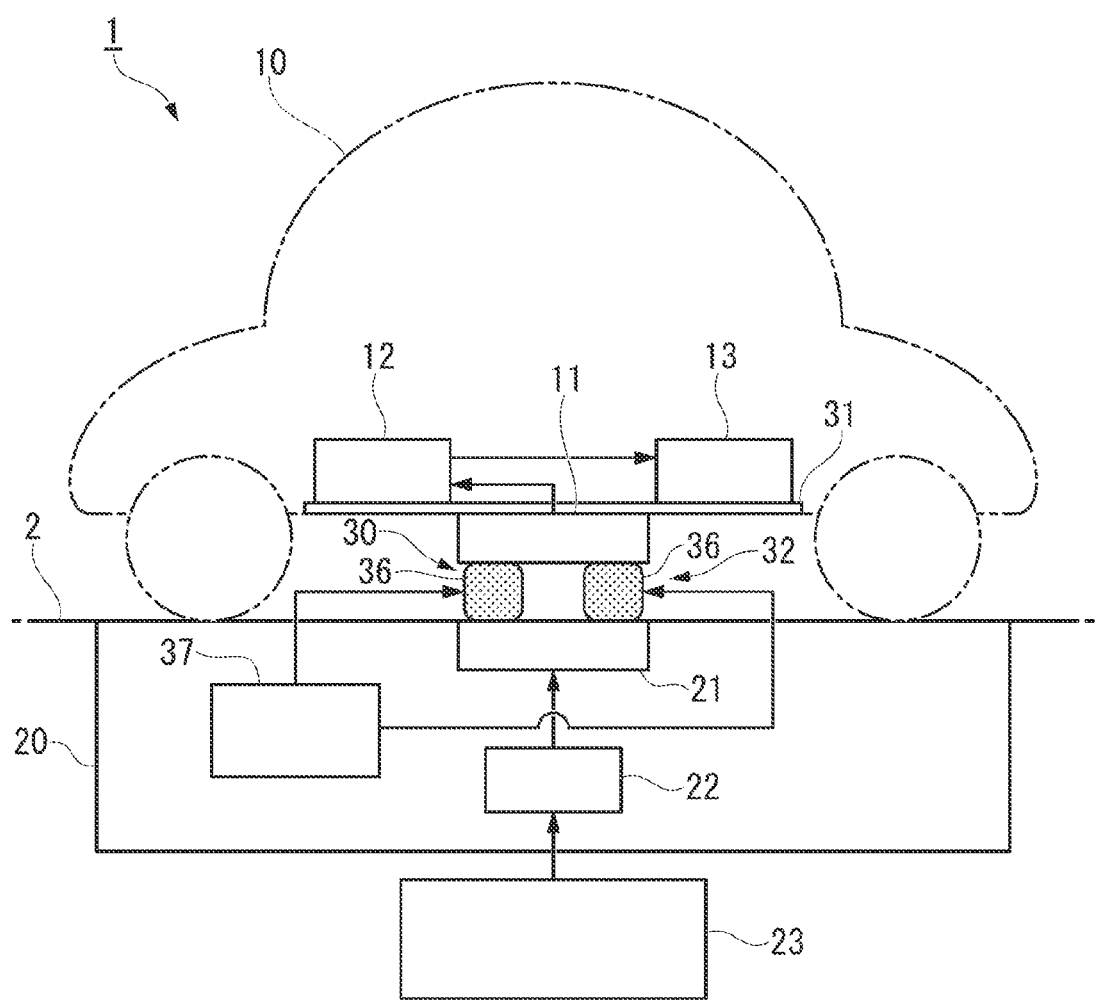
FIG. 9 is a view showing the entire structure of a wireless power-supplying system of a fifth embodiment of the disclosure.

FIG. 9 is a view showing the entire structure of a wireless power-supplying system 1 of the fifth embodiment of the disclosure.

Each of a power-receiving coil (coil) 11 and a power-transmitting coil (coil) 21 of this embodiment includes a coil (winding wire) which is not shown in the figures and a casing that stores the coil (winding wire). The lower surface (an opposing surface 11a shown in FIG. 10) of the power-receiving coil 11 and the upper surface (an opposing surface 21a shown in FIG. 10) of the power-transmitting coil 21 of the casing are made of a non-magnetic and non-electrically conductive material.

The wireless power-supplying system 1 includes a heat-transfer device 30 that cools at least one (both in this embodiment) of the power-receiving coil 11 and the power-transmitting coil 21 provided in the vehicle 10 and the stop station 20, respectively.

The heat-transfer device 30 of this embodiment includes expansion-contraction members 36 that swell out through the injection of a refrigerant (cooling water) and a refrigerant injector (cooling water injector) 37 that injects a refrigerant into the expansion-contraction members 36. The expansion-contraction members 36 are included in a flexible heat-transfer member 32 as in the third embodiment.

Figure 10:
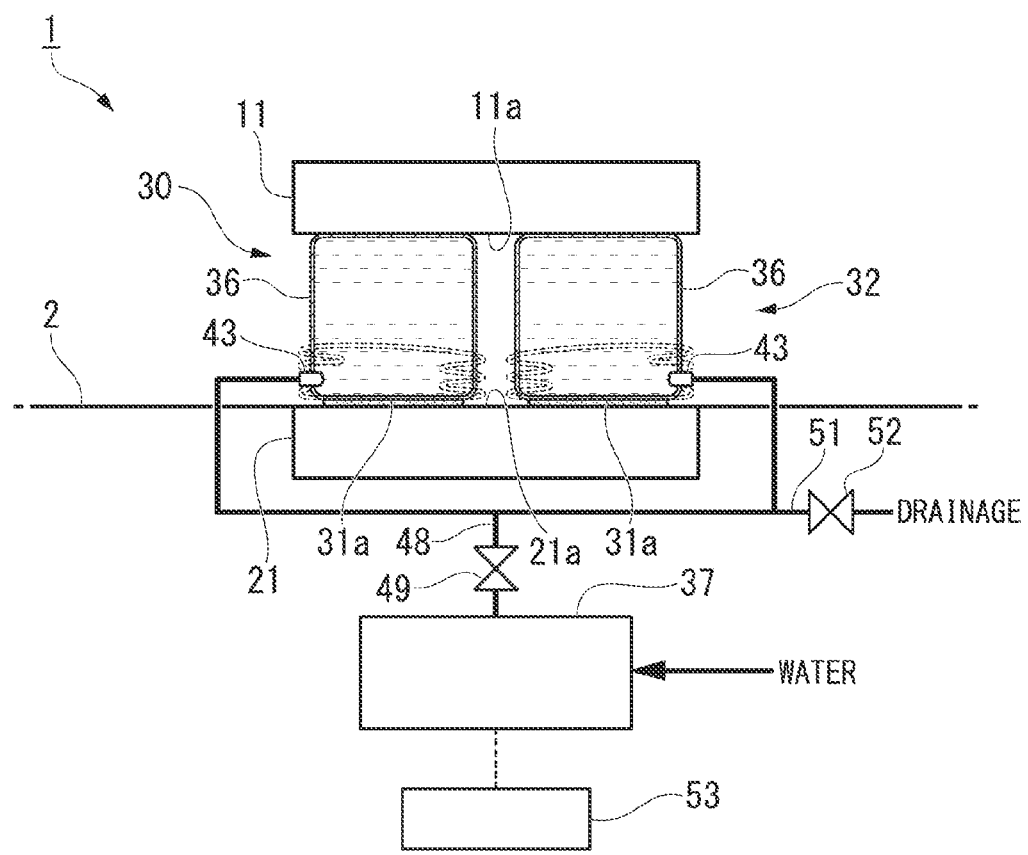
FIG. 10 is a view showing the structure of a heat-transfer device of the fifth embodiment of the disclosure.

FIG. 10 is a view showing the structure of the heat-transfer device 30 of the fifth embodiment of the disclosure.

As shown in FIG. 10, the expansion-contraction members 36 swell by the injection of a refrigerant and come into contact with the power-receiving coil 11. The expansion-contraction member 36 of this embodiment is a bag-shaped member made of a flexible resin such as elastomer, and is non-magnetic and non-electrically conductive. The expansion-contraction member 36 is formed with a thickness and/or a material that allows the temperature of the injected refrigerant to be substantially the same as the temperature of the outer surface of the expansion-contraction member 36.

The expansion-contraction member 36 maintains a shape that comes into contact with the power-receiving coil 11 through the injection of a refrigerant. Accordingly, when the refrigerant is not injected, the expansion-contraction member 36 contracts as shown by a dotted line in FIG. 10 and does not contact with the power-receiving coil 11. The expansion-contraction members 36 are provided on the opposing surface 21a of the opposing surfaces 11a and 21a of the power-receiving coil 11 and the power-transmitting coil 21 that face each other during the wireless power supply. Bottom of the bag-shaped expansion-contraction member 36 of this embodiment is bonded onto the opposing surface 21a, which faces up, of the power-transmitting coil 21. It is preferable that a non-magnetic and non-electrically conductive adhesive, for example, an epoxy resin or the like is used as an adhesive 31a to bond the expansion-contraction member 36.

The expansion-contraction member 36 includes an injection-discharge port 43 that functions as both an injection port and a discharge port for a refrigerant. The injection-discharge port 43 is provided near the bottom of the expansion-contraction member 36. The injection-discharge port 43 is a non-magnetic and non-electrically conductive resin molding, and is adapted to be capable of being connected to the refrigerant injector 37. Since a plurality of expansion-contraction members 36 having the above-mentioned structure are provided on the opposing surface 21a in this embodiment, the refrigerant injector 37 injects a refrigerant into the plurality of expansion-contraction members 36.

Since the refrigerant injector 37 is connected to, for example, a water supply or the like, the refrigerant injector 37 injects water as a refrigerant to be injected into the expansion-contraction members 36. Since water of the water supply is non-magnetic and has low electrical conductivity, the water of the water supply hardly affects the wireless power supply. The refrigerant injector 37 includes an electromagnetic valve 49, and injects water (a refrigerant) into the plurality of expansion-contraction members 36 through a refrigerant flowing line 48 at a predetermined water pressure of the water supply. The refrigerant flowing line 48 is branched on the downstream side of the electromagnetic valve 49 and is connected to the injection-discharge ports 43 of the plurality of expansion-contraction members 36. When the water pressure of the water supply is low, a pump may be added to the refrigerant injector 37 to increase the pressure of water to be injected.

Further, a refrigerant discharge line 51, which discharges a refrigerant, is connected to the refrigerant flowing line 48 on the downstream side of the electromagnetic valve 49. An electromagnetic valve 52, which opens and closes the line, is provided on the refrigerant discharge line 51. Since the electromagnetic valves 49 and 52 include metal components, the electromagnetic valves 49 and 52 are provided outside an area (the power-receiving coil 11 or the vicinity thereof) in which an electromagnetic field is generated due to the wireless power supply between the power-receiving coil 11 and the power-transmitting coil 21. Furthermore, it is preferable that a portion of the refrigerant flowing line 48, which enters the area in which the electromagnetic field is generated, is formed of a non-magnetic and non-electrically conductive material, for example, a resin hose or the like.

The refrigerant injector 37 is connected to the injection-discharge ports 43 through the refrigerant flowing line 48, and the injection and non-injection of a refrigerant are switched by the drive of the electromagnetic valve 49 for opening/closing. The heat-transfer device 30 of this embodiment includes a controller 53 that controls the drive of the refrigerant injector 37 depending on time. The controller 53 includes a timer. Accordingly, when a certain time has passed, the controller 53 closes the electromagnetic valve 49 and opens the electromagnetic valve 52 to discharge a refrigerant. Further, when the controller 53 determines that the discharge of the refrigerant ends by lapse of time, the controller 53 opens the electromagnetic valve 49, closes the electromagnetic valve 52, and controls the drive of the refrigerant injector 37 so that the refrigerant is injected.

Next, the power supply operation of the wireless power-supplying system 1 having the above-mentioned structure will be described.

As shown in FIG. 9, the wireless power-supplying system 1 performs the wireless power supply between the vehicle 10 and the stop station 20. Since the stop position of the vehicle 10 depends on a driver's driving operation, the stop position of the vehicle 10 has a certain amount of variation. Since a magnetic field resonance method is employed to transmit power between the power-receiving coil 11 and the power-transmitting coil 21 in regard to the supply of power, the wireless power-supplying system 1 has tolerance to positional deviation between resonance coils provided in both the vehicle 10 and the stop station 20 and can efficiently transmit power over a long distance.

When the wireless power supply is performed, the power-receiving coil 11, the power-transmitting coil 21, and the like, which transmit and receive high-frequency power, generate heat.

Since the stop station 20, which is provided with the power-transmitting coil 21, is installed on the ground, it can be regarded that the heat capacity of the stop station 20 is infinite. For this reason, the temperature of the power-transmitting coil 21 hardly rises. Since the heat capacity of the vehicle 10, which is provided with the power-receiving coil 11, is smaller than that of the stop station 20, the temperature of the power-receiving coil 11 relatively easily rises.

As shown in FIG. 10, the wireless power-supplying system 1 includes the heat-transfer device 30 that cools the power-receiving coil 11. The heat-transfer device 30 opens the electromagnetic valve 49 of the refrigerant injector 37 and injects a refrigerant into the expansion-contraction members 36. The expansion-contraction members 36 swell by the injection of a refrigerant and press the opposing surface 11a of the power-receiving coil 11. Since the expansion-contraction members 36 are filled with the refrigerant, the refrigerant removes the heat generated by the power-receiving coil 11. Further, since the expansion-contraction members 36 also come into contact with the opposing surface 21a of the power-transmitting coil 21, the heat generated by the power-transmitting coil 21 is also removed. Since the expansion-contraction member 36 is formed with a thickness and/or a material that allows the temperature of the injected refrigerant to be substantially the same as the temperature of the outer surface of the expansion-contraction member 36, the heat generated by the power-receiving coil 11 or the power-transmitting coil 21 is quickly transferred to the refrigerant in the expansion-contraction member 36. Accordingly, cooling is efficiently performed.

Even when the expansion-contraction members 36 are at positions where the power-receiving coil 11 and the power-transmitting coil 21 substantially face each other but there is positional deviation between them, the expansion-contraction members 36 can come into close contact with the power-receiving coil 11 since the expansion-contraction members 36 can be freely deformed so as to make up for the positional deviation by swelling via the injection of a refrigerant. Accordingly, it is possible to directly cool the power-receiving coil 11 while the positional deviation between the vehicle 10 and the stop station 20 is allowed, so that high cooling capacity can be obtained. In this embodiment, it is also possible to cool the power-receiving circuit 12 or the battery 13 through the heat transfer plate 31 by cooling the power-receiving coil 11 (see FIG. 9).

Further, the expansion-contraction member 36, the refrigerant to be injected into the expansion-contraction member 36, and the injection-discharge port 43 provided near the bottom of the expansion-contraction member 36 are non-magnetic and non-electrically conductive (or have low electrical conductivity) in this embodiment. According to this structure, the expansion-contraction member 36, the refrigerant, and the injection-discharge port 43 do not hinder the formation of an electromagnetic field generated due to the wireless power supply or do not generate heat caused by eddy current (or the amount of heat is small if any). Accordingly, as shown in FIG. 10, the expansion-contraction members 36 can be provided on the opposing surface 21a of the power-transmitting coil 21 that faces the power-receiving coil 11 during the wireless power supply. Since the expansion-contraction members 36 are disposed on the opposing surface 21a of the power-transmitting coil 21 as described above, it is possible to save the space of the heat-transfer device 30. Furthermore, since the power-transmitting coil 21 of the stop station 20 is provided with the expansion-contraction members 36, it is not necessary to add a cooling structure to the vehicle 10.

Moreover, in this embodiment, the expansion-contraction member 36 includes the injection-discharge port 43 that functions as both an injection port and a discharge port for the refrigerant, and the heat-transfer device 30 includes the refrigerant injector 37 that is connected to the injection-discharge ports 43 and switches the injection and non-injection of the refrigerant. As time goes by, the refrigerant injected into the expansion-contraction members 36 is heated and cooling capacity deteriorates. However, according to this structure, cooling capacity can be kept since a refrigerant can be interchanged. Specifically, when the electromagnetic valve 49 is closed and the electromagnetic valve 52 is opened while the refrigerant is not injected, the refrigerant is discharged and the expansion-contraction members 36 contract. After that, when the electromagnetic valve 52 is closed and the electromagnetic valve 49 is opened, a cold refrigerant can be injected into the expansion-contraction members 36. The interchange of the refrigerant is timer-controlled by the controller 53 and is repeated at a predetermined interval.

As described above, this embodiment provides the wireless power-supplying system 1 that performs the wireless power supply using the power-receiving coil 11 and the power-transmitting coil 21 between the vehicle 10 and the stop station 20. The wireless power-supplying system 1 includes the heat-transfer device 30 that cools at least one of the power-receiving coil 11 and the power-transmitting coil 21 provided in the vehicle 10 and the stop station 20. The heat-transfer device 30 includes the expansion-contraction members 36 that come into contact with the power-receiving coil 11 by swelling via the injection of a refrigerant. According to this structure, even though the position of the power-receiving device relative to the position of the power-supplying device is not fixed, the expansion-contraction members are deformed so as to make up for positional deviation by swelling via the injection of a refrigerant and come into close contact with the coil that generates heat due to the wireless power supply. For this reason, it is possible to directly cool the power-receiving coil 11 without providing a cooling structure on the vehicle 10 while the positional deviation is allowed, so that high cooling capacity is obtained.

Accordingly, the wireless power-supplying system 1 is obtained which is capable of appropriately cooling the power-receiving coil 11 and the power-transmitting coil 21, which generate heat due to the wireless power supply, without requiring time to position the vehicle 10 and the stop station 20 when the vehicle 10 and the stop station 20 are movable relative to each other.

Sixth Embodiment

Next, a sixth embodiment of the disclosure will be described. In the following description, the same components as the components of the above-mentioned embodiments or components equivalent to the components of the above-mentioned embodiments will be denoted by the same reference numerals and the description thereof will be omitted.

Figure 11:
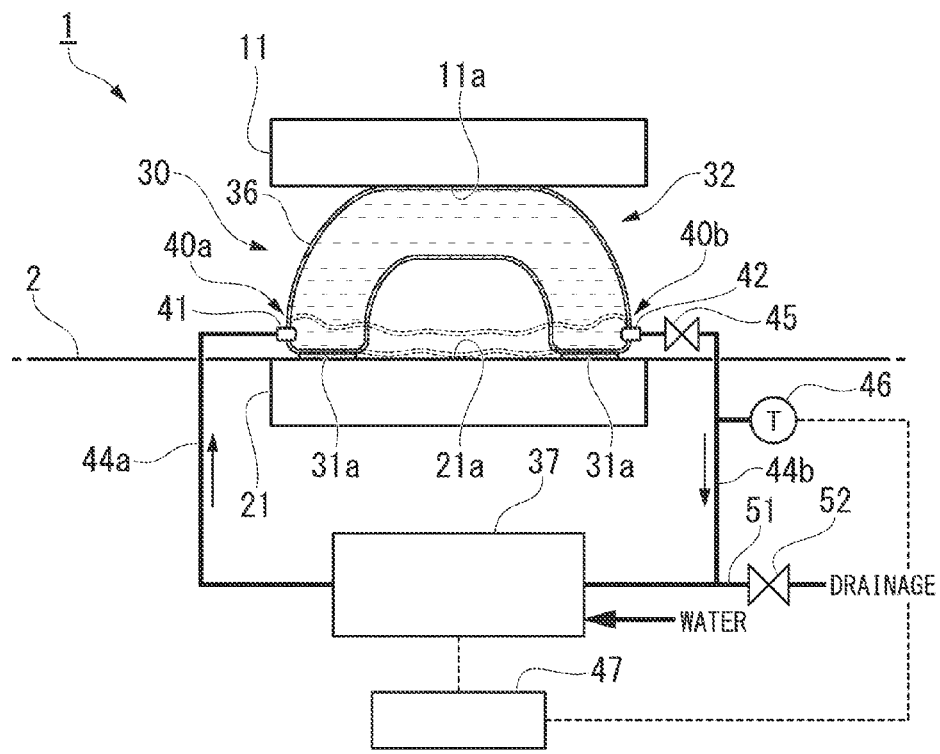
FIG. 11 is a view showing the structure of a heat-transfer device of a sixth embodiment of the disclosure.

FIG. 11 is a view showing the structure of a heat-transfer device 30 of the sixth embodiment of the disclosure.

The sixth embodiment is different from the fifth embodiment in terms of the structures of an expansion-contraction member 36 and a refrigerant injector 37 of the heat-transfer device 30 as shown in FIG. 11. The expansion-contraction member 36 is included in a flexible heat-transfer member 32 as in the third embodiment.

The expansion-contraction member 36 of the sixth embodiment is an arch-like tube made of elastomer or the like, and is non-magnetic and non-electrically conductive. The expansion-contraction member 36 maintains a shape that comes into contact with the power-receiving coil 11 through the injection of a refrigerant. When the refrigerant is not injected, the expansion-contraction member 36 contracts as shown by a dotted line of FIG. 11 and does not contact with the power-receiving coil 11. A pair of leg portions 40a and 40b of the expansion-contraction member 36 of this embodiment are bonded onto the opposing surface 21a, which faces up, of the power-transmitting coil 21 by an adhesive 31a.

The expansion-contraction member 36 includes an injection port 41 and a discharge port 42 for a refrigerant. The injection port 41 is provided on the leg portion 40a on one end portion of the expansion-contraction member 36. The discharge port 42 is provided on the leg portion 40b on the other end portion of the expansion-contraction member 36. The injection port 41 and the discharge port 42 are non-magnetic and non-electrically conductive resin moldings, and can be connected to the refrigerant injector 37. The refrigerant injector 37 is connected to the injection port 41 through a refrigerant circulation line 44a, and is connected to the discharge port 42 through a refrigerant circulation line 44b.

The refrigerant injector 37 is connected to a water supply, and includes a pump (not shown) that pumps a refrigerant. The refrigerant circulation line 44b is provided with a throttle valve 45 that makes the expansion-contraction member 36 swell out with a refrigerant. Since the throttle valve 45 is a non-magnetic and non-electrically conductive resin molding or is provided outside an area (the power-receiving coil 11 or the vicinity thereof) in which an electromagnetic field is generated due to the wireless power supply between the power-receiving coil 11 and the power-transmitting coil 21, the throttle valve 45 does not hinder the formation of an electromagnetic field generated due to the wireless power supply or does not generate heat caused by eddy current. Further, a temperature sensor 46, which measures the temperature of a refrigerant, is provided on the refrigerant circulation line 44b on the downstream side of the throttle valve 45. Furthermore, a refrigerant discharge line 51, which discharges the refrigerant, is connected to the refrigerant circulation line 44b on the downstream side of the throttle valve 45. The refrigerant discharge line 51 is provided with an electromagnetic valve 52 that opens and closes the line. The electromagnetic valve 52 may be always slightly opened, so that part of the heated refrigerant may be discharged and replaced with a refrigerant supplied from a water supply.

The refrigerant injector 37 injects at least part of a refrigerant discharged from the discharge port 42 through the refrigerant circulation line 44b, into the injection port 41 through the refrigerant circulation line 44a; and circulates the refrigerant. The heat-transfer device 30 of the sixth embodiment includes a controller 47 that controls the drive of the refrigerant injector 37 depending on the measurement result of the temperature sensor 46. When the controller 47 determines that the measurement result of the temperature sensor 46 exceeds a predetermined threshold, the controller 47 controls the refrigerant injector 37 so that the drive speed of the pump of the refrigerant injector 37 is increased and the flow velocity of a refrigerant is increased.

According to the sixth embodiment having the above-mentioned structure, it is possible to cool the power-receiving coil 11 by pressing the expansion-contraction member 36, into which a refrigerant is injected, against the power-receiving coil 11. Even when the expansion-contraction member 36 is at a position where the power-receiving coil 11 and the power-transmitting coil 21 substantially face each other but there is positional deviation between them, the expansion-contraction member 36 can come into close contact with the power-receiving coil 11 since the expansion-contraction member 36 can be freely deformed so as to make up for the positional deviation by swelling via the injection of a refrigerant. Accordingly, it is possible to directly cool the power-receiving coil 11 while the positional deviation between the vehicle 10 and the stop station 20 is allowed, so that high cooling capacity can be obtained.

Further, according to the sixth embodiment, the expansion-contraction member 36 includes the injection port 41 and the discharge port 42 for a refrigerant; and the heat-transfer device 30 includes the refrigerant injector 37 that is connected to the injection port 41 and the discharge port 42 and injects at least part of a refrigerant discharged from the discharge port 42 into the injection port 41 and circulates the refrigerant. According to this structure, since the refrigerant injected into the expansion-contraction member 36 always flows, the deterioration of cooling capacity, which is caused by the accumulation of heat at a portion of the expansion-contraction member 36 coming into contact with the power-receiving coil 11, does not occur. Accordingly, it is possible to cool the vehicle 10 for a long time. The vehicle 10 means devices, which are provided in the vehicle 10, among the devices used for the wireless power supply, that is, the power-receiving coil 11, and the power-receiving circuit 12 and the battery 13 that are thermally connected to each other through the heat transfer plate 31.

Accordingly, different from, for example, the fifth embodiment, even when the wireless power supply is performed for a long time, the refrigerant injector 37 does not need to intermittently open and close the electromagnetic valve 49 to interchange a refrigerant therein through the switching of the discharge and injection of a refrigerant. Furthermore, when the temperature of the refrigerant rises, the controller 47 controls the drive of the refrigerant injector 37 so as to increase the flow velocity of the refrigerant. Accordingly, it is possible to lower the temperature of a refrigerant by reliably preventing the accumulation of heat and facilitating the interchange of part of the refrigerant.

Figure 12:
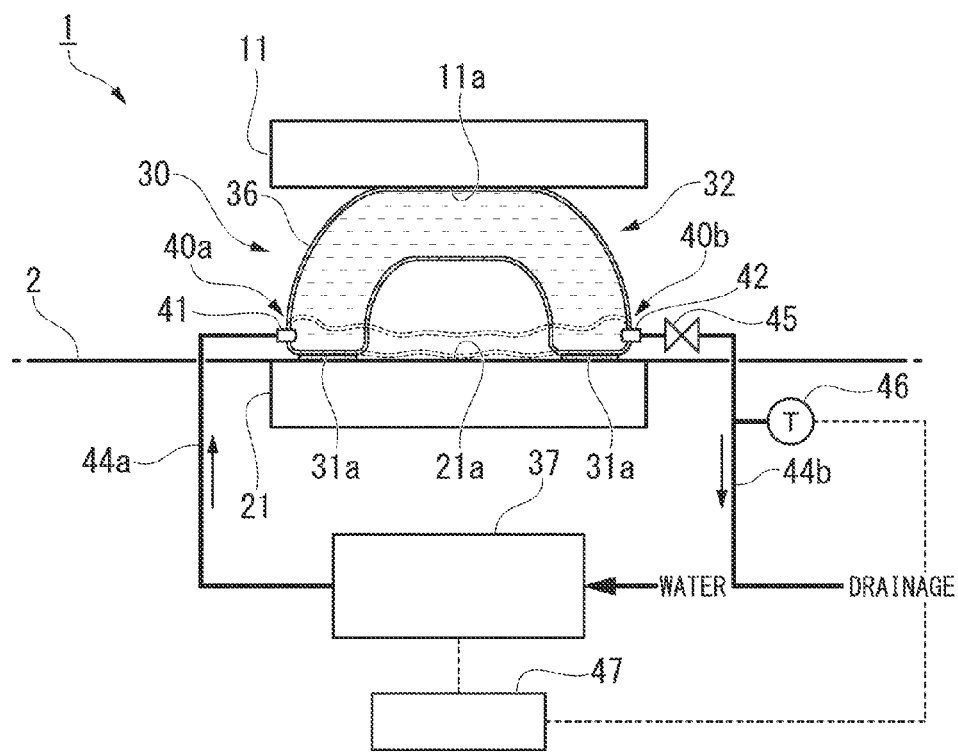
FIG. 12 is a view showing the structure of the heat-transfer device of the sixth embodiment of the disclosure.

In addition, the structure shown in FIG. 12 can be employed as a modification of the sixth embodiment.

FIG. 12 is a view showing the structure of a modification of the heat-transfer device 30 of the second embodiment of the disclosure.

In the following description, the same components as the components of the above-mentioned embodiments or components equivalent to the components of the above-mentioned embodiments will be denoted by the same reference numerals and the description thereof will be omitted.

In the heat-transfer device 30 shown in FIG. 12, a discharge port 42 of the expansion-contraction member 36 is not connected to a refrigerant injector 37 and a refrigerant circulation line 44b is directly connected to drainage. According to this structure, a refrigerant can be discharged from the discharge port 42 while a refrigerant is injected into the injection port 41 of the expansion-contraction member 36 by the refrigerant injector 37. When water is sufficiently obtained from the water supply, it is possible to always maintain cooling capacity constant and to cool the vehicle 10 for a long time by draining all refrigerant without circulating the refrigerant as described above. Since all refrigerant discharged from the discharge port 42 is drained, it is not necessary to install the electromagnetic valve 52 (see FIG. 11).

Seventh Embodiment

Next, a seventh embodiment of the disclosure will be described. In the following description, the same components as the components of the above-mentioned embodiments or components equivalent to the components of the above-mentioned embodiments will be denoted by the same reference numerals and the description thereof will be omitted.

Figure 13:
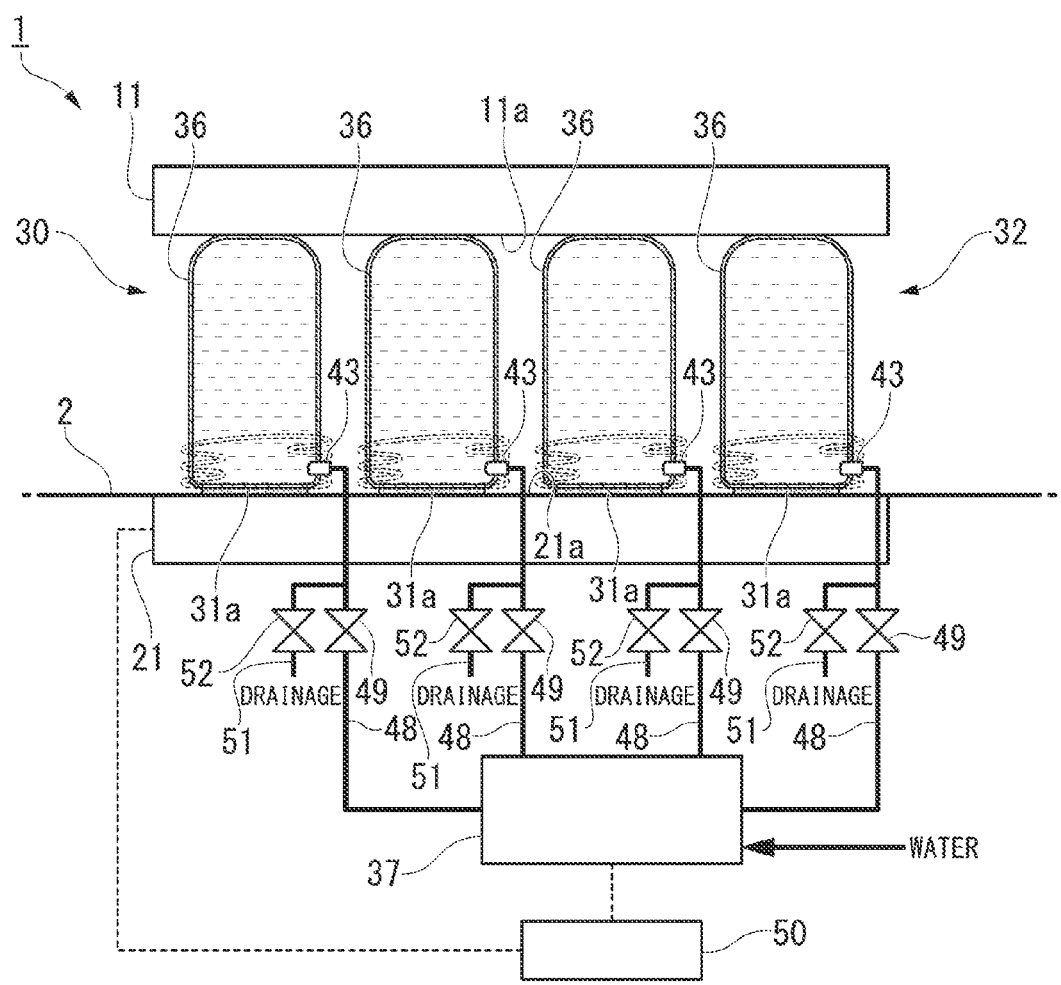
FIG. 13 is a view showing the structure of a heat-transfer device of a seventh embodiment of the disclosure.
Figure 14A:
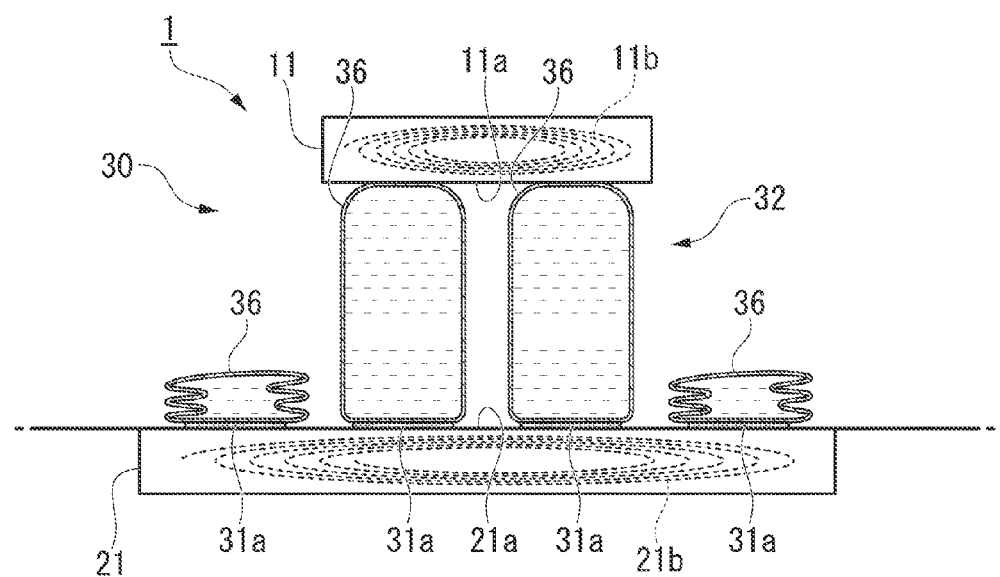
FIG. 14A is a view showing the operation of the heat-transfer device of the seventh embodiment of the disclosure.
Figure 14B:
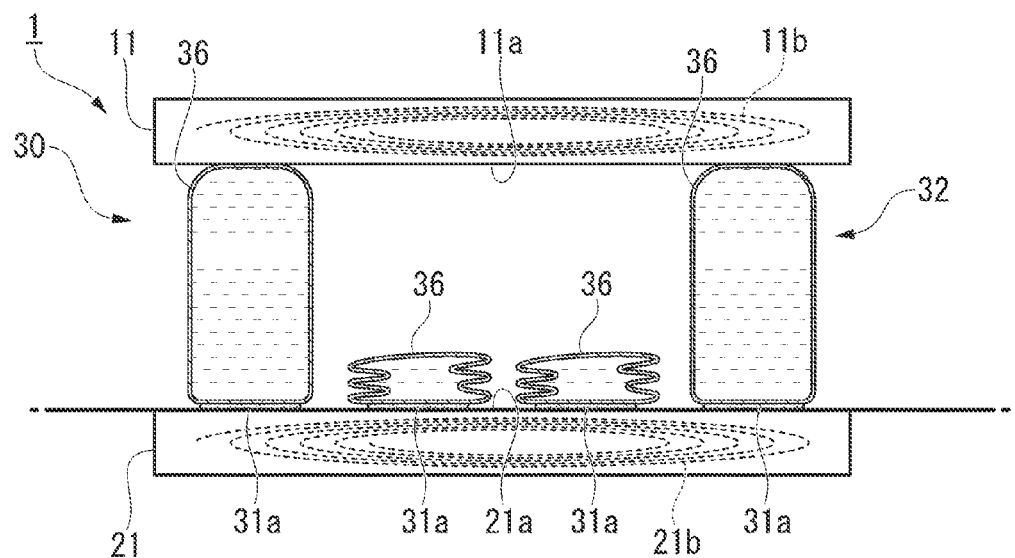
FIG. 14B is a view showing the operation of the heat-transfer device of the seventh embodiment of the disclosure.

FIG. 13 is a view showing the structure of a heat-transfer device 30 of the seventh embodiment of the disclosure. FIGS. 14A and 14B are views showing the operation of the heat-transfer device 30 of the seventh embodiment of the disclosure. In FIGS. 14A and 14B, reference numeral 11b denotes a coil (winding wire) that is provided in the power-receiving coil 11 and reference numeral 21b denotes a coil (winding wire) that is provided in the power-transmitting coil 21.

The seventh embodiment is different from the above-mentioned embodiments in terms of the structures of expansion-contraction members 36 and a refrigerant injector 37 of the heat-transfer device 30 as shown in FIG. 13. The expansion-contraction members 36 are included in a flexible heat-transfer member 32 as in the third embodiment.

The expansion-contraction member 36 of the seventh embodiment is a rod-like tube made of elastomer or the like, and is non-magnetic and non-electrically conductive. The expansion-contraction member 36 maintains a shape that comes into contact with the power-receiving coil 11 through the injection of a refrigerant. Accordingly, when the refrigerant is not injected, the expansion-contraction member 36 contracts as shown by a dotted line of FIG. 13 and does not contact with the power-receiving coil 11. The expansion-contraction member 36 includes an injection-discharge port 43 that functions as both an inflow port and a discharge port for a refrigerant as in the above-mentioned fifth embodiment.

A plurality of the expansion-contraction members 36 of the seventh embodiment are provided at positions that are different from each other. The expansion-contraction members 36 are disposed in a matrix shape or in the shape of concentric circles on an opposing surface 21a of the power-transmitting coil 21, and the bottoms of the expansion-contraction members 36 are bonded to the opposing surface 21a by an adhesive 31a. The refrigerant injector 37 separately and independently injects a refrigerant into the plurality of expansion-contraction members 36. The refrigerant injector 37 includes a refrigerant flowing line 48, an electromagnetic valve 49, a refrigerant discharge line 51, and an electromagnetic valve 52 for each expansion-contraction member 36.

The heat-transfer device 30 of the seventh embodiment includes a controller 50 that controls the drive of the refrigerant injector 37 depending on the size of the power-receiving coil 11 facing the power-transmitting coil 21. The controller 50 enables the vehicle 10 and the stop station 20 to wirelessly communicate with each other by using the power-receiving coil 11 and the power-transmitting coil 21 as antennas to transmit signals, transmits and receives information about the size of the power-receiving coil 11 mounted on the vehicle 10 through wireless communication, and controls the drive of the refrigerant injector 37 depending on the size of the power-receiving coil 11.

The sizes of the power-receiving coil 11 and the power-transmitting coil 21 are arbitrary as long as the wireless power supply can be performed. The power-receiving coil 11 may be smaller than the power-transmitting coil 21 as shown in FIG. 14A, and the size of the power-receiving coil 11 may be equivalent to that of the power-transmitting coil 21 as shown in FIG. 14B. The controller 50 acquires information about the size of the power-receiving coil 11 by the wireless communication between the vehicle 10 and the stop station 20, and specifies the expansion-contraction members 36 facing the outer edge portion of the opposing surface 11a of the power-receiving coil 11 (more precisely, a coil 11b provided in the device), and controls the drive of the refrigerant injector 37 so that a refrigerant is injected into the expansion-contraction members 36. A method of transmitting information about the size of the power-receiving coil 11 to the controller 50 is not limited to wireless communication. For example, a driver of the vehicle 10 may input the information to the controller 50 by the operation of a button.

For example, when the power-receiving coil 11 is smaller than the power-transmitting coil 21 as shown in FIG. 14A, a refrigerant is injected into the expansion-contraction members 36 provided at the central portion of the opposing surface 21a and a refrigerant is not injected into the expansion-contraction members 36 provided at the outer edge portion of the opposing surface 21a. Since the expansion-contraction members 36 provided at the central portion of the opposing surface 21a face the coil 11b (winding wire), cooling efficiency is high. Since the expansion-contraction members 36 provided at the outer edge portion of the opposing surface 21a do not come into contact with the power-receiving coil 11, it is possible to prevent the unnecessary consumption of refrigerant or unnecessary energy consumption by not injecting a refrigerant into the expansion-contraction members 36.

Further, for example, when the size of the power-receiving coil 11 is equivalent to that of the power-transmitting coil 21 as shown in FIG. 14B, a refrigerant is injected into the expansion-contraction members 36 provided at the outer edge portion of the opposing surface 21a and a refrigerant is not injected into the expansion-contraction members 36 provided at the central portion of the opposing surface 21a. Since the expansion-contraction members 36 provided at the outer edge portion of the opposing surface 21a face the coil 11b (winding wire), cooling efficiency is high. Since the expansion-contraction members 36 provided at the central portion of the opposing surface 21a do not face the coil 11b (winding wire) (the expansion-contraction members 36 face the central portion of the coil 11b), cooling efficiency is low in comparison with the expansion-contraction members 36 provided at the outer edge portion. For this reason, it is possible to prevent the unnecessary consumption of refrigerant or unnecessary energy consumption by not injecting a refrigerant into the expansion-contraction members 36. The annular coil 11b (winding wire) is assumed in FIG. 14B. However, in the cases of other types of coils, the expansion-contraction members 36, which correspond to a portion of the coil 11b where much heat is generated, may be selected according to the type of the coil and a refrigerant may be injected into the selected expansion-contraction members 36.

According to the seventh embodiment having the above-mentioned structure, it is possible to cool the power-receiving coil 11 by pressing the expansion-contraction members 36, into which a refrigerant is injected, against the power-receiving coil 11. Even when the expansion-contraction members 36 are at positions where the power-receiving coil 11 and the power-transmitting coil 21 substantially face each other but there is positional deviation between them, the expansion-contraction members 36 can come into close contact with the power-receiving coil 11 since the expansion-contraction members 36 can be freely deformed so as to make up for the positional deviation by swelling via the injection of a refrigerant. Accordingly, it is possible to directly cool the power-receiving coil 11 while the positional deviation between the vehicle 10 and the stop station 20 is allowed, so that high cooling capacity can be obtained.

According to the disclosure, even though the position of the power-receiving device relative to the position of the power-supplying device is not fixed, the expansion-contraction members are deformed so as to make up for positional deviation by swelling via the injection of a refrigerant and come into close contact with the coil that generates heat due to the wireless power supply. For this reason, it is possible to directly cool the power-receiving coil while the positional deviation is allowed, so that high cooling capacity is obtained.

Further, according to the seventh embodiment, the plurality of expansion-contraction members 36 are provided at positions that are different from each other, and the heat-transfer device 30 includes the refrigerant injector 37 that separately and independently injects a refrigerant into the plurality of expansion-contraction members 36. According to this structure, even when the size of the power-receiving coil 11 and the size of the power-transmitting coil 21 are different from each other, it is possible to efficiently cool a heat-generation portion (coil 11b) of the power-receiving coil 11 by pressing the expansion-contraction members 36 against the heat-generating portion. Furthermore, it is possible to prevent the unnecessary consumption of refrigerant or unnecessary energy consumption by not injecting a refrigerant into the expansion-contraction members 36 that are disposed at a portion that has low cooling efficiency and does not come into contact with the power-receiving coil 11 or does not face the heat-generating portion (coil 11b).

Clean water has been exemplified as a refrigerant to be injected into the expansion-contraction members 36 in the above-mentioned embodiments. However, any material that is non-magnetic and has low electrical conductivity, such as gas, liquid, or a gel-like material, may be used as a refrigerant regardless of the kind of a refrigerant. Particularly, it is preferable that a refrigerant has high heat capacity, and liquid or a gel-like material can be suitably used as a refrigerant. Further, it is preferable that antifreeze, such as ethylene glycol, a mixture of water and antifreeze, or a material having a low solidifying point, such as oil, is used as a refrigerant when this system is installed in a cold region.

Furthermore, a structure in which the expansion-contraction member 36 is pressed against the opposing surface 11a of the power-receiving coil 11 has been described in the above-mentioned embodiments, but a contact portion of the power-receiving coil 11 may not be the opposing surface 11a. For example, even though the expansion-contraction member 36 is pressed against the side surface of the power-receiving coil 11, the power-receiving coil 11 can be cooled. However, since the expansion-contraction member 36 cannot be disposed on the opposing surface 21a of the power-transmitting coil 21 in this case, an installation space, which is slightly larger than the installation space in the embodiment, is required.

Moreover, for example, a structure in which the heat-transfer device 30 cools both the power-receiving coil 11 and the power-transmitting coil 21 has been described in the above-mentioned embodiments, but the heat-transfer device 30 may cool any one of the power-receiving coil 11 and the power-transmitting coil 21. For example, when the leg portions 40a and 40b of the expansion-contraction member 36 of the sixth embodiment shown in FIG. 11 are fixed to the road surface 2 outside the power-transmitting coil 21, the heat-transfer device 30 can cool only the power-receiving coil 11.

Further, for example, a structure in which the power-receiving circuit 12 or the battery 13 is cooled through the heat transfer plate 31 has been described in the above-mentioned embodiments. However, when the power-receiving circuit 12 or the battery 13 does not need to be cooled, the heat transfer plate 31 is omitted and the heat-transfer device 30 may cool only the power-receiving coil 11.

Furthermore, for example, in the description of the first to seventh embodiments, power has been supplied to the bottom of the vehicle 10 from the stop station 20 installed on the ground. However, the directivity of the supply of power is not limited. For example, power may be supplied to the side portion, the front portion, or the rear portion of the vehicle 10 from a wall, and power may be supplied to a roof portion of the vehicle 10 from the ceiling.

Moreover, for example, a case in which the power-receiving device is the vehicle 10 and the power-supplying device is the stop station 20 has been exemplified in the first to seventh embodiments, but the disclosure is not limited thereto. For example, the power-receiving device may be the stop station 20 and the power-supplying device may be the vehicle 10. Further, the disclosure can be applied even though at least one of the power-receiving device and the power-supplying device is a vehicle or a movable body, such as a ship, a submarine, or an aircraft.

Furthermore, for example, the disclosure is particularly effective when being combined with the wireless power supply using a magnetic field resonance method allowing large positional deviation, but heat generated due to the wireless power supply can be dissipated even though the disclosure is combined with the wireless power supply using other methods, such as an electromagnetic induction method. Moreover, since the sizes, types and shapes of the power-receiving coil 11 and the power-transmitting coil 21 are arbitrary as long as the wireless power supply can be performed, the sizes, types, and shapes of the power-receiving coil 11 may be different from those of the power-transmitting coil 21. The flexible heat-transfer member 32 may be disposed at a position where the flexible heat-transfer member 32 does not hinder the wireless power supply, that is, may be disposed at a position that surrounds the power-receiving coil 11 and the power-transmitting coil 21 at a distance where the flexible heat-transfer member 32 does not affect the electromagnetic field A.

The preferred embodiments of the disclosure have been described above with reference to the drawings, but the disclosure is not limited to the above-mentioned embodiments. The shape, the combination, and the like of each component described in the above-mentioned embodiments are merely exemplary, and may be modified in various ways on the basis of the requirements of design without departing from the scope of the disclosure.

Further, the heat transfer plate 31 of each embodiment is a flat plate-like heat-transfer member that has a function to conduct (transfer) heat generated by the power-receiving coil 11 as a main function, but the disclosure is not limited thereto. The heat transfer plate 31 of the disclosure is not limited to the shape of a flat plate, and may be, for example, a block-shaped heat-transfer member in which a plurality of heat radiation fins (dissipate ribs) are erected on a plate-like portion like in a heat sink, or a thin heat-transfer member such as aluminum foil. For example, when the heat transfer plate 31 of the disclosure is formed so as to include heat radiation fins, it is possible to improve an effect of dissipating heat generated by the power-receiving coil 11. Accordingly, it is possible to cool the power-receiving coil 11.

Each of the power-receiving coil 11 and the power-transmitting coil 21 of the disclosure includes not only an electrical wire member wound in the shape of a coil, a core and a resonance capacitor, but also elements, which allow the power-receiving coil 11 and the power-transmitting coil 21 to function mechanistically, such as a bobbin or a holding frame that holds the electrical wire in the shape of a coil, a filler, an electrical wire for electrically connecting the resonance capacitor or a holding material for holding the resonance capacitor, and a case that protects these components.

The heat-transfer device 30 may be part of the stop station (power-supplying device) 20 in the above-mentioned embodiments. When the heat-transfer device 30 is part of the stop station (power-supplying device) 20, the stop station (power-supplying device) 20 may include a component, such as the flexible heat-transfer members 32 included in the heat-transfer devices 30 described in the above-mentioned embodiments.

In the above-mentioned embodiments, a vertical direction in which the flexible heat-transfer member 32 expands and contracts is not limited to a direction exactly perpendicular at 90 degree to the moving direction of the vehicle 10. An angle may be predefined at which the flexible heat-transfer member 32 comes into contact with a component having the heat of a vehicle (the heat transfer plate 31 or the power-receiving coil) when the flexible heat-transfer member 32 expands. When the expansion-contraction direction of the flexible heat-transfer member 32 is within the predefined angle, it can be regarded that the flexible heat-transfer member 32 expands and contracts in the vertical direction.

INDUSTRIAL APPLICABILITY

A heat-transfer device, a power-supplying device, and a wireless power-supplying system are obtained that can appropriately dissipate heat generated due to the wireless power supply, that is, the heat generated by a coil without requiring time to position a power-receiving device and a power-supplying device when the power-receiving device and the power-supplying device are movable relative to each other in the wireless power-supplying system that performs the wireless power supply between a vehicle and a stop station.

What is claimed is:

1. A heat-transfer device that transfers heat between a power-receiving device and a power-supplying device for a wireless power supply, at least one of the power-receiving device and the power-supplying device being movable, the heat-transfer device being a different member from the power-supplying device and from the power-receiving device, and the heat-transfer device comprising:
a flexible heat-transfer member that transfers heat generated due to the wireless power supply, from one of the power-receiving device and the power-supplying device to the other thereof and has at least one of tiltability in the moving direction and extensibility in a direction perpendicular to the moving direction.

2. The heat-transfer device according to claim 1, wherein each of the power-receiving device and the power-supplying device includes a coil that performs the wireless power supply,
the heat-transfer device further comprises:
a heat transfer plate that is provided around the coil of one of the power-receiving device and the power-supplying device; and
the flexible heat-transfer member that is erected around the coil of the other of the power-receiving device and the power-supplying device and comes into contact with the heat transfer plate.

3. The heat-transfer device according to claim 2, wherein the flexible heat-transfer member includes a metal brush, and
the metal brush is implanted in a metal pipe in which a refrigerant flows.

4. The heat-transfer device according to claim 2, wherein the flexible heat-transfer member includes a spring member, and
the spring member biases a metal pipe, in which a refrigerant flows, to the heat transfer plate.

5. The heat-transfer device according to claim 2, wherein the flexible heat-transfer member includes an expansion-contraction member that comes into contact with the heat transfer plate through injection of a refrigerant.

6. The heat-transfer device according to claim 5, wherein the expansion-contraction member includes at least one of a rod-like tube and an arch-like tube.

7. The heat-transfer device according to claim 1, wherein one of the power-receiving device and the power-supplying device is a vehicle, and
the other of the power-receiving device and the power-supplying device is a stop station at which the vehicle stops.

8. The heat-transfer device according to claim 5, wherein the expansion-contraction member is non-magnetic and non-electrically conductive.

9. The heat-transfer device according to claim 5, wherein the expansion-contraction member is provided on an opposing surface where the coils face each other during the wireless power supply.

10. The heat-transfer device according to claim 8, wherein the expansion-contraction member includes an injection-discharge port that functions as both an injection port and a discharge port for the refrigerant,
the heat-transfer device further comprises:
a refrigerant injector that is connected to the injection-discharge port and switches the injection and non-injection of the refrigerant.

11. The heat-transfer device according to claim 8, wherein the expansion-contraction member includes an injection port and a discharge port for the refrigerant,
the heat-transfer device further comprises:
a refrigerant injector that is connected to the injection port and injects the refrigerant while the refrigerant is discharged from the discharge port.

12. The heat-transfer device according to claim 8, wherein the expansion-contraction member includes an injection port and a discharge port for the refrigerant, the heat-transfer device further comprises:
a refrigerant injector that is connected to the injection port and the discharge port and injects at least a part of the refrigerant, which is discharged from the discharge port, into the injection port and circulates the refrigerant.

13. The heat-transfer device according to claim 8, wherein a plurality of the expansion-contraction members are provided at positions that are different from each other,
the heat-transfer device further comprises:
a refrigerant injector that separately and independently injects the refrigerant into the plurality of expansion-contraction members.

14. A power-supplying device that wirelessly supplies power to a power-receiving device, the power-supplying device comprises:
a heat-transfer device that transfers heat generated due to the wireless power supply from one of the power-receiving device and the power-supplying device, of which at least one is movable, to the other thereof,
wherein the heat-transfer device includes a flexible heat-transfer member that has at least one of tiltability in the moving direction and extensibility in a direction perpendicular to the moving direction, and the heat-transfer device being a different member from the power-supplying device and from the power-receiving device.

15. A wireless power-supplying system that performs a wireless power supply between a power-receiving device and a power-supplying device of which at least one is movable, the wireless power-supplying system comprises:
a heat-transfer device that transfers heat, which is generated due to the wireless power supply from one of the power-receiving device and the power-supplying device to the other thereof,
wherein the heat-transfer device includes a flexible heat-transfer member that has at least one of tiltability in the moving direction and extensibility in a direction perpendicular to the moving direction, and the heat-transfer device being a different member from the power-supplying device and from the power-receiving device.

* * * * *